(12) United States Patent
Ogura et al.

(10) Patent No.: US 6,674,707 B2
(45) Date of Patent: *Jan. 6, 2004

(54) DIGITAL RECORDED DATA REPRODUCING DEVICE

(75) Inventors: Youichi Ogura, Ehime (JP); Koichi Urita, Ehime (JP); Shinichiro Sato, Ehime (JP); Yoshimasa Oda, Ehime (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 169 days.

This patent is subject to a terminal disclaimer.

(21) Appl. No.: 09/936,513

(22) PCT Filed: Jan. 17, 2001

(86) PCT No.: PCT/JP01/00235
§ 371 (c)(1),
(2), (4) Date: Nov. 13, 2001

(87) PCT Pub. No.: WO01/54125
PCT Pub. Date: Jul. 26, 2001

(65) Prior Publication Data
US 2002/0159350 A1 Oct. 31, 2002

(30) Foreign Application Priority Data

Jan. 17, 2000 (JP) ........................................ 2000-008021

(51) Int. Cl.[7] ................................................. G11B 7/00
(52) U.S. Cl. ............... 369/59.22; 369/59.1; 369/124.01
(58) Field of Search ............................. 369/47.1, 47.35, 369/47.48, 53.1, 53.35, 59.1, 59.12, 59.17, 59.21, 59.22, 59.23, 59.26, 124.01, 124.04, 124.15

(56) References Cited

U.S. PATENT DOCUMENTS 5,130,963 A 7/1992 Kusano et al.
5,523,989 A 6/1996 Ishibashi
5,550,799 A 8/1996 Inoue et al.

(List continued on next page.)

FOREIGN PATENT DOCUMENTS

| DE | 196 49 970 A1 | 6/1997 |
| EP | 0 210 330 A2 | 2/1987 |
| EP | 0 798 711 A2 | 1/1997 |

(List continued on next page.)

OTHER PUBLICATIONS

Specification, Claims, Abstract and Drawings for U.S. Ser. No. 09/601,796, filed Sep. 22, 2000.
Grohov, P.K., "Encyclopedia Dictionary of Electronics," pp. 24–25, Moscow, Russian Language, 1993.

(List continued on next page.)

*Primary Examiner*—Muhammad Edun
(74) *Attorney, Agent, or Firm*—Wenderoth, Lind & Ponack, L.L.P.

(57) ABSTRACT

In a digital recorded data reproduction which applies PRML signal processing, it is an object to enhance a reproduction signal quality and a playability for an abnormal signal by an offset correction and a phase-interpolation-type digital phase-locked loop. A prescribed frequency band of a reproduction signal is emphasized by a waveform equalizing unit 2, and its output signal is sampled by an asynchronous clock at an analog/digital converter 3. After a sampling signal is subjected to the offset correction, PR equalization is performed by a transversal filter 6 and a tap weighting factor control unit 8 which applies LMS algorithm, and a signal of a regular sampling phase is reproduced from its output signal by a high-order interpolation filter 7 employing a digital phase-locked loop 11. The reproduced signal in a regular phase is demodulated by a maximum likelihood decoder 12, thereby to reproduce digital data recorded on a medium.

32 Claims, 24 Drawing Sheets

U.S. PATENT DOCUMENTS

| | | | |
|---|---|---|---|
| 5,986,592 | A | 11/1999 | Nakagawa et al. |
| 6,064,643 | A | 5/2000 | Tanoue et al. |
| 6,088,311 | A | 7/2000 | Katoh |
| 6,091,700 | A | 7/2000 | Kobayashi |
| 6,208,481 | B1 * | 3/2001 | Spurbeck et al. ............. 360/65 |
| 6,215,833 | B1 * | 4/2001 | Yada ......................... 375/372 |

FOREIGN PATENT DOCUMENTS

| | | |
|---|---|---|
| EP | 889473 | 1/1999 |
| JP | 59-38939 | 3/1984 |
| JP | 1-235081 | 9/1989 |
| JP | 4-76828 | 3/1992 |
| JP | 5-144024 | 6/1993 |
| JP | 6-96522 | 4/1994 |
| JP | 8-17145 | 1/1996 |
| JP | 8-69672 | 3/1996 |
| JP | 8-96516 | 4/1996 |
| JP | 8-315517 | 11/1996 |
| JP | 9-63085 | 3/1997 |
| JP | 9-247137 | 9/1997 |
| JP | 9-251639 | 9/1997 |
| JP | 10-11762 | 1/1998 |
| JP | 10-27366 | 1/1998 |
| JP | 10-208250 | 8/1998 |
| JP | 11-73645 | 3/1999 |
| JP | 11-86449 | 3/1999 |
| JP | 11-195271 | 7/1999 |
| JP | 11-328874 | 11/1999 |
| JP | 2000-243032 | 9/2000 |
| JP | 2001-6287 | 1/2001 |
| KR | 244770 | 2/2000 |
| WO | WO 92/04712 | 3/1992 |
| WO | 00/36602 | 6/2000 |

OTHER PUBLICATIONS

English Abstract of JP 09161274A, from which DE 196 49 970 A1 claims priority.

U.S. patent application Ser. No. 09/629,049, Joo et al., filed Jul. 31, 2000.

U.S. patent application Ser. No. 09/629,050, Joo et al., filed Jul. 31, 2000.

* cited by examiner $Z^{-1}$ : 1T delay element output signal after phase interpolation phase synchronization holding means VCO control means VCO control means VCO control means VCO control means VCO control means

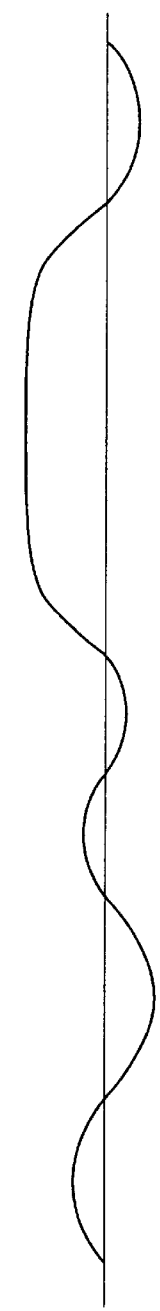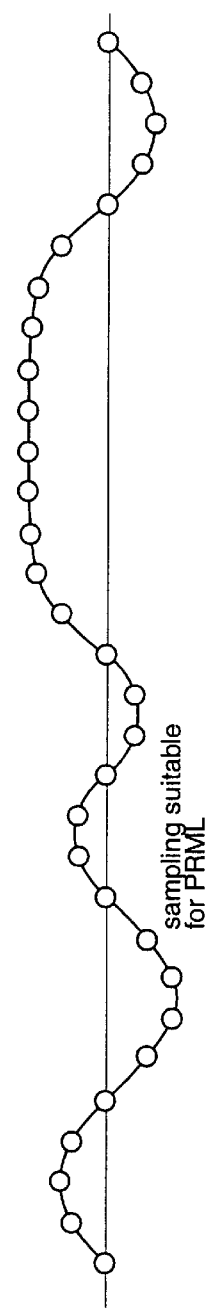

DIGITAL RECORDED DATA REPRODUCING DEVICE

TECHNICAL FIELD

The present invention relates to a digital recorded data reproducing device which reproduces digital data recorded in a recording medium and, more particularly, to one having its phase-locked loop and offset correction improved, and to one which has reproduction digital data quality improved as well as playability enhanced under unfavorable conditions such as a deterioration in a reproduced waveform quality due to tilt, a reproduction on condition of bad signal-noise ratio, and a frequent occurrence of defect or the like.

As is generally known, a tilt represents a deviation of an angle made between a perpendicular standing on a signal surface of an optical disk and an optical axis of a laser beam, and a defect represents a disturbing factor to a reproduced waveform such as a scratch or a fingerprint adhesion on the signal surface of the optical disk.

BACKGROUND ART

A method of keeping a linear velocity constant to uniformize recording density on a recording medium is commonly employed as a method for recording digital data on an optical disk medium as seen in Compact Disk or DVD.

When digital data are reproduced based on a reproduction signal of an optical disk which is subjected to mark width modulation and to digital modulation recording so that linear recording density is constant, a phase-locked pull-in is conventionally performed by detecting a phase of a clock component held by the reproduction signal and constituting a phase-locked loop.

At the time, when the frequency of the clock component held by the reproduction signal and the frequency of a clock generated by the phase-locked loop differ vastly, it is likely that a phase-locked pull-in is not completed or that a pseudo pull-in to a different frequency is performed.

As a means for avoiding this problem, conventionally a reproduction linear velocity cycle is detected by a specified pulse length or pulse interval included in a reproduction signal and control of a disk rotation speed or of a free-running frequency of a phase-locked loop is performed, thereby enabling a normal phase-locked pull-in.

For example, there is a disk reproduction system as shown in FIG. 23. A digital recording code as shown in FIG. 24(a) is recorded on an optical disk 55 so that linear recording density is constant. Recorded data are supposed to be data regulated to have three to fourteen pieces of consecutive "0" or "1" as in 8-16 modulation system, for example. A signal obtained by a reproduction at a reproducing means 56 such as an optical pickup has its amplitude attenuated in a higher frequency component according to an increase in the recording density of the recorded data in a linear direction as shown in FIG. 24(a). This is because an effect of interference is significantly produced according to an increase in recording density, and thus, the signal obtained by reproduction is amplified by a preamplifier not shown and is subjected to correction which emphasizes a higher frequency component by a waveform equalizing means 2 thereafter.

A reproduction signal subjected to high frequency emphasis is sampled to a digital signal with multiple bits by an analog/digital converter 3 as a means for converting an analog signal to a digital signal as shown in FIG. 24(b). At this time, a reproduction clock generated by a VCO (voltage Control Type Oscillator) 40 is employed as a sampling clock, and when a phase of the reproduction clock by the VCO 40 and a phase of a clock component held by the reproduction signal by the reproducing means 56 are synchronized with each other, sampling data as shown in FIG. 24(c) are obtained.

FIG. 24(c) illustrates sampling data suitable particularly for Partial Response Maximum Likelihood (hereinafter, abbreviated as "PRML") signal processing system. The PRML signal processing system is one which requires no high frequency component in a reproduction signal by adding a waveform interference intentionally and enhances an error rate of reproduction data by using a maximum likelihood decoding method, which demodulates the most probable series by a probability calculation considering the waveform interference, together in a reproduction system in which an amplitude of a high frequency component of a signal deteriorates and a signal-noise ratio increases with an increase in recording density in a linear recording direction.

The sampled digital signal with multiple bits is inputted to an offset correction means 4 to correct an offset component included in the reproduction digital signal. The reproduction digital signal subjected to offset correction is inputted to a transversal filter 6 to perform a partial response equalization.

At this time, it is characteristic that an equalization output signal is multivalued by applying the partial response equalization as shown in FIG. 24(d). A weighting factor of a tap of the transverse filter 6 is supplied by a tap weighting factor setting means 57 for setting weighting factors employing Least Mean Square (hereinafter, referred to as "LMS") algorithm which minimizes a mean square value of an equalization error. The multivalued output signal of the transversal filter 6 is demodulated by a viterbi decoder 58 as a kind of maximum likelihood decoder to obtain binary digital data.

A phase-locked reproduction clock used in sampling by the analog/digital converter 3 is controlled as follows. That is, a position where an output signal of the offset correction means 4 crosses zero level is successively detected from the output signal, a synchronization pattern length in a specified period over 1 frame is detected employing an output of a zero-cross length detector 59 which counts the sampling number between neighboring zero-crosses, and further a detection cycle of a synchronization pattern is detected by a frequency error detector 13, thereby deciding a frequency error amount to perform frequency control of the reproduction clock. Further, phase information of reproduction digital data is detected by a phase comparator 9 employing the output signal of the offset correction means 4, and a phase error amount to perform phase synchronizaiton control of the reproduction clock and the reproduction digital data is decided.

The VCO 40 is controlled by a loop filter 14 for frequency control and a digital/analog converter 42b employing the frequency error amount outputted from the frequency error detector 13 so as to control frequency to an area where the reproduction clock can be synchronized with the reproduction digital signal. Meanwhile, the VCO 40 is controlled by a loop filter 60 for phase control and a digital/analog converter 42a employing the phase error amount outputted from the phase comparator 9 so that the reproduction clock is synchronized with the reproduction digital signal. That is, the VCO 40 has outputs of the digital/analog converter 42a and the digital/analog converter 42b, which are added by an adder 61, inputted as its control input.

By a series of the operation, a phase of the reproduction clock and a phase of a clock component held by the reproduction digital data can be synchronized with each other, resulting in a stable and accurate reproduction of digital data recorded on an optical disk medium.

However, when a phase error detection as a part of the phase-locked loop is performed based on a signal before the partial response equalization processing as described above, phase error information is incorrect, and thus a jitter of the phase-locked loop increases, under such conditions as the deterioration in the reproduction signal due to tilt and insufficiencies of equalization characteristics of the waveform equalizing means. Thus, a signal sampled by the analog/digital converter is out of normal phase state, and therefore the performance cannot be sufficiently achieved in a partial response equalization by the transversal filter. Therefore, the quality of the reproduction signal is deteriorated and the deterioration in the error rate may be caused.

Further, though it is already proposed to perform a phase error detection based on the output signal of the transversal filter as a means for avoiding such state, it cannot be an effective avoidance means because a loop delay in the phase-locked loop is increased, and a range of phase-locked pull-in is decreased or the stability of the phase synchronization is lost according to the method.

The present invention is made to solve the above-mentioned problems and has for its object to provide a digital recorded data reproducing device which is most suitable for a partial response equalization, is high in phase-locked pull-in capacity, and is capable of decreasing an error rate even under such conditions as the characteristic deterioration due to tilt and insufficiencies of analog equalization.

DISCLOSURE OF THE INVENTION

According to claim 1 of the present invention, a digital recorded data reproducing device comprises: an analog/digital converting means for sampling a reproduction signal of a recording medium to digital data asynchronously with a phase of a clock component included in the signal; a digital data correction means for correcting an offset component and an amplitude from the sampled signal; an equalizing filter for subjecting the corrected signal to a partial response equalization; an interpolation filter for reproducing a signal in a regular sampling phase from the signal subjected to the partial response equalization by interpolation; a filter factor control means for adaptively controlling a filter factor of the equalizing filter so that an equalization error is minimum based on an output signal of the interpolation filter; a phase-locked loop for detecting a phase error based on the output signal of the interpolation filter to update a filter factor of the interpolation filter; and a maximum likelihood decoder for subjecting the output signal of the interpolation filter to a maximum likelihood decoding according to a type of partial response at equalization by the equalizing filter so as to perform a data demodulation.

Therefore, a maximum likelihood decoding can be performed based on interpolation data in a regular sampling phase, resulting in a digital data demodulation which is not affected by a waveform deterioration due to tilt of a reproduction signal or the like and is suitable for a partial response maximum likelihood decoding.

According to claim 2 of the present invention, a digital recording data reproducing comprises: an analog/digital converting means for sampling a reproduction signal of a recording medium to digital data asynchronously with a phase of a clock component included in the signal; a digital data correction means for correcting an offset component and an amplitude from the sampled signal; an equalizing filter for subjecting the corrected signal to a partial response equalization; a phase-locked loop for detecting a phase error based on an output signal of the equalizing filter; a filter factor control means for adaptively controlling a filter factor of the equalizing filter so that an equalization error is minimum based on the output signal of the equalizing filter as well as controlling the filter factor so that there is no phase error based on an output of the phase-locked loop; and a maximum likelihood decoder for performing a maximum likelihood decoding according to a type of partial response at equalization by the equalizing filter so as to perform a data demodulation.

Therefore, a maximum likelihood decoding can be performed based on interpolation data in a regular sampling phase, resulting in a digital data demodulation which is not affected by a waveform deterioration due to tilt of a reproduction signal or the like and is suitable for a partial response maximum likelihood decoding. Further, it is effective for reduction in circuit scale or cost, low power consumption, or decrease in an error rate.

According to claim 3 of the present invention, a digital recorded data reproducing device as defined in claim 1 or 2 comprises: a clock generating means for generating a clock with a phase asynchronous with that of a clock signal included in the reproduction signal of the recording medium; a frequency control means for controlling a frequency of the clock generated by the clock generating means based on the output of the phase-locked loop; and a phase synchronization maintaining means for performing a control so that a phase of the clock generated by the clock generating means maintains a synchronization state based on the output of the phase-locked loop.

Therefore, an oscillation control of the clock generating means can be performed only by a rough frequency control and an up/down control in the neighborhood of synchronization frequency, resulting in a phase-locked loop with high accuracy as well as in drastic reduction in analog elements. Further, there is no need to perform a high frequency operation, thereby requiring no measures against noise generation.

According to claim 4 of the present invention, a digital recorded data reproducing device as define in claims 3 comprises: a delta/sigma modulating means for subjecting control signals from the frequency control means and the phase synchronization maintaining means to a delta/sigma modulation; and a low pass filter for removing a high frequency component of an output signal of the delta/sigma modulating means.

Therefore, a disturbance in a phase-locked loop when a rough control is switched to an up/down control can be suppressed and a smooth frequency followup can be performed, whereby a more stable phase-locked pull-in can be realized, resulting in an enhancement in error rate of reproduction data. Further, a control of the clock generating means may also be designed in consideration mainly of an enhancement in control performance of the rough control, thereby simplifying an analog circuit.

According to claim 5 of the present invention, a digital recorded data reproducing device as defined in claim 4 comprises a time constant varying means for varying a time constant of the low pass filter.

Therefore, when a reproduction speed of a recording medium is changed, a time constant can be varied according to the speed, whereby a smooth frequency followup can be performed independently of the reproduction speed in a data reproduction system which has a mode of reproducing the recording medium at double speed.

According to claim 6 of the present invention, in a digital recorded data reproducing device as defined in claim 1 or 2, when an offset adjustment is performed, the digital data correction means adds an amplitude component of a point where a center line of a sampled waveform crosses zero level with respect to the point, while the means adds a prescribed value according to a polarity of a reproduction code with respect to the other points where a code is decided.

Therefore, an accuracy of offset error information increases, and even when an offset adjustment is made to respond to a direct current fluctuation including a high frequency component, a stabilization of the operation and decrease in noise after adjustment are possible, whereby a data reproducing means available for the direct current fluctuation can be realized.

According to claim 7 of the present invention, in a digital recorded data reproducing device as defined in claim 1 or 2, when an offset adjustment is performed, the digital data correction means adds an amplitude component of a point where a center line of a sampled waveform crosses zero level with respect to the point, while the means adds a value according to a polarity of a reproduction code with respect to the other points where a code is decided, and makes the additional value different between at seek operation and at the other time.

Therefore, an accuracy of offset error information increases, and, even when an offset adjustment is made to respond to a direct current fluctuation including a high frequency component, a stabilization of the operation and a decrease in noise after adjustment are possible, whereby a data reproducing means available for the direct current fluctuation can be realized, and a control according to an operating state is possible, thereby enhancing a playability.

According to claim 8 of the present invention, in a digital recorded data reproducing device as defined in claim 7, the digital data correction means increases the additional value at seek operation while the means decreases the additional value in a phase synchronization state.

Therefore, it is possible to increase a followup property during seek operation and to suppress control noise in a phase synchronization state, thereby enabling the most suitable offset control.

According to claim 9 of the present invention, in a digital recorded data reproducing device as defined in claim 1 or 2, when an offset adjustment is performed, the digital data correction means monitors a cumulative additional value for a prescribed period of time at each point in a sampled waveform and gives feedback of an error amount for a direct current part discretely to the direct current part.

Therefore, it is possible to perform a restoration from a pseudo lock state as an abnormal state at high speed, thereby enhancing a playability.

According to claim 10 of the present invention, in a digital recorded data reproducing device as defined in claim 2, after performing a phase-locked pull-in, the filter factor control means performs a partial response equalization successively as well as sets its loop gain to be sufficiently low as compared with the phase-locked loop, and performs a switching to an intermittent control operation when the phase error is decreased.

Therefore, quality of attitude data is increased, thereby enhancing a speed of phase-locked pull in.

According to claim 11 of the present invention, in a digital recorded data reproducing device comprising: a preamplifier for emphasizing an output amplitude of a reproduction signal from a recording medium; a waveform equalizing means for emphasizing a prescribed frequency band of the emphasized signal; an analog/digital converting means for sampling the equalized signal to a digital data with multiple bits asynchronously with a phase of a clock component included in the signal by a clock generated by an oscillator; an offset correction means for decreasing an offset component from the sampled signal; an automatic gain control means for adjusting the amplitude of the output signal to a required level; a transversal filter for subjecting the signal subjected to the amplitude adjustment to a partial response equalization; a high-order interpolation filter for reproducing a signal in a regular sampling phase from the signal subjected to the partial response equalization by a high-order interpolation; a tap weighting factor control means for controlling a tap weighting factor of the transversal filter from the interpolation output signal adaptively so that an equalization error is minimum; a phase comparator for detecting a phase error from the interpolation output signal; a loop filter for smoothing the phase error signal; and a maximum likelihood decoder for subjecting the interpolation output signal to a maximum likelihood decoding according to a type of partial response at equalization by the transversal filter so as to perform a data demodulation, the asynchronously sampled signal is subjected to the partial response equalization, and a phase synchronization is compensated by a phase-interpolation-type digital phase-locked loop so that a data demodulation is performed.

Therefore, even under such conditions as a characteristic deterioration of a reproduction signal due to tilt and insufficiencies of analog equalization, it is possible to decrease a jitter in a phase-locked loop as well as to reproduce the most suitable partial response equalization signal by detecting phase error information after partial response equalization, thereby enabling a stable digital data reproduction which reduces an error rate as well as has high phase-locked pull-in capacity.

According to claim 12 of the present invention, in a digital recorded data reproducing device comprising: a preamplifier for emphasizing an output amplitude of a reproduction signal from a recording medium; a waveform equalizing means for emphasizing a prescribed frequency band of the emphasized signal; an analog/digital converting means for sampling the equalized signal to a digital data with multiple bits asynchronously with a phase of a clock component included in the signal by a clock generated by an oscillator; an offset correction means for decreasing an offset component from the sampled signal; an automatic gain control means for adjusting the amplitude of the output signal to a required levels a phase-interpolation-type transversal filter, which has functions of a transversal filter and a high-order interpolation filter together, for subjecting the signal subjected to the amplitude adjustment to a partial response equalization and reproducing a signal in a regular sampling phase from the signal subjected to the partial response equalization by a high-order interpolation; a phase comparator for detecting a phase error from the output signal; a loop filter for smoothing the phase error signal to obtain phase information; a tap weighting factor setting means for setting a weighting factor of a tap of the phase-interpolation-type transversal filter which makes an equalization error minimum and is for reproducing a normal sampling signal from the phase information and the output signal of the phase-interpolation-type transversal filter; and a maximum likelihood decoder for subjecting the interpolation output signal to a maximum likelihood decoding according to a type of partial response at equalization by the phase-interpolation-type transversal filter so as to perform a data demodulation, the partial response equalization and a digital phase-locked loop are realized by the same filter.

Therefore, a transversal filter and a high-order interpolation filter, which are supposed to be large in circuit scale, can be communized only by the transversal filter, thereby realizing reduction in circuit scale and particularly low power consumption at high speed reproduction.

According to claim 13 of the present invention, in a digital recorded data reproducing device as defined in claim 12, the tap weighting factor setting means has a filter factor for each phase which is divided in a phase direction, updates the filter factor for phase control according to the phase information outputted from the loop filter, updates a filter factor for partial response equalization so as to minimize the equalization error based on the output signal of the phase-interpolation-type transversal filter, and superimposes the filter factor for phase control and the filter factor for partial response equalization, thereby setting the weighting factor of a tap of the phase-interpolation-type transversal filter.

Therefore, a means for setting a filter factor for phase control and a means for setting a tap weighting factor for partial response equalization can be operated individually, whereby even when a partial response equalization and a data interpolation in a regular phase are communized only by the phase-interpolation-type transversal filter, an effective control with high accuracy is possible without losing both characteristics.

According to claim 14 of the present invention, in a digital recorded data reproducing device as defined in claim 12, the tap weighting factor setting means comprises: a temporary judging circuit for detecting an equalization target value which corresponds to partial response system based on the output signal of the transversal filter; an equalization error detector for detecting the equalization error based on the equalization target value and the output signal of the high-order interpolation filter; a correlator for detecting correlation between the equalization error and the output signal of the high-order interpolation filter; a feedback gain regulator for multiplying an output of the correlator by the same number as a gain to regulate a feedback gain; a tap factor updating part for adding an output of the feedback gain regulator to a weighting factor of each tap to update a tap factor; a first register for storing each amplitude value when a channel rate of Nyquist characteristics is divided in a time direction correspondingly to each tap; a tap factor folding means for superimposing each tap stored in the first register as well as a Nyquist interpolation factor in each phase and a tap weighting factor for partial response equalization which factor is outputted from the tap factor updating part; plural delay elements having delay amount of unit delay time, to which of the first stage the signal subjected to the partial response equalization is inputted and which are interconnected in series; an multiplier which is set correspondingly to an input of the delay element in the first stage among the plural unit delay elements as well as outputs of a connection point between delay elements and of a delay element in the last stage; an adder for obtaining the sum total of outputs of the multiplier to generate an output of the tap weighting factor setting means; a second register which is set correspondingly to the multiplier; a register value updating means for updating a value of the second register based on an output of the tap factor folding means; and a selector which is set according to the second register and selects an amplitude value stored in the second register to output to the corresponding multiplier, according to the output phase information of the loop filter.

Therefore, there is provided a specific constitution for realizing a tap factor folding which enables an effective control with high accuracy without losing both characteristics even when a partial response equalization and a data interpolation in a regular phase are communized only by the phase-interpolation-type transversal filter.

According to claim 15 of the present invention, in a digital recorded data reproducing device as defined in claim 12 comprising: a frequency error detector for detecting a frequency error from the output of the traversal filter; and a loop filter for frequency control for smoothing the detected frequency error and giving the same to the oscillator as a control signal, a gain of a loop for frequency control which includes the loop filter for frequency control is reduced in a state where the frequency error is under a prescribed value, so that the processing shifts from a frequency pull-in control to a phase-locked pull-in control, a loop gain of a loop for phase control which includes the phase comparator is reduced in a case where the prescribed number of synchronization pattern is detected, so that the processing shifts to a partial response adaptive automatic equalization control by the phase-interpolation-type tap weighting factor control means, and the processing shifts to an interval-control-type partial response adaptive automatic equalization control which discretely reflects a cumulative additional value of an equalization error amount on a tap weighting factor in a state where an equalization error by the partial response adaptive automatic equalization control is under a prescribed value.

Therefore, it is possible to realize a stable phase-locked loop and to prevent a state out of control after the processing shifts from a rough control to a phase synchronization state.

According to claim 16 of the present invention, in a digital recorded data reproducing device as defined in claim 12, the tap weighting factor setting means sets a feedback gain when the filter factor for phase control is updated so as to be sufficiently larger than a feedback gain when the filter factor for the partial response equalization is updated, and updates the filter factor for the partial response equalization discretely.

Therefore, a competition between a control of a filter factor for phase control and a control of a tap weighting factor for partial response equalization are prevented, and a phase control is given priority to, thereby realizing a stable phase-locked loop as well as enhancing a playability because an accuracy of a partial response equalization is not lost, and an out-of-control state does not occur against an abnormal signal.

According to claim 17 of the present invention, a digital recorded data reproducing device comprises: a preamplifier for emphasizing an output amplitude of a reproduction signal from a recording medium; a waveform equalizing means for emphasizing a prescribed frequency band of the emphasized signal; an analog/digital converting means for sampling the equalized signal to a digital data with multiple bits asynchronously with a phase of a clock component included in the signal by a clock generated by an oscillator; an offset correction means for decreasing an offset component from the sampled signal; an automatic gain control means for adjusting the amplitude of the output signal to a required level; a transversal filter for subjecting the signal subjected to the amplitude adjustment to a partial response equalization; a high-order interpolation filter for reproducing a signal in a regular sampling phase from the signal subjected to the partial response equalization by a high-order interpolation; a tap weighting factor control means for controlling a tap weighting factor of the transversal filter from the interpolation output signal adaptively so that an equalization error is minimum; a phase comparator for detecting a phase error from the interpolation output signal; and a loop filter for smoothing the phase error signal; and a maximum likelihood decoder for subjecting the interpolation output signal to a maximum likelihood decoding according to a type of partial response at equalization by the transversal filter so as to perform a data demodulation, as well as comprises: a frequency control means for performing a control based on a cycle of a synchronization pattern included in recording data and a time width with which the synchronization pattern is detected; a phase synchronization maintaining means for monitoring a control range of the loop filter after a frequency and a frequency of a clock component included in the reproduction signal are pulled in to the neighborhood and performing an up/down control of a clock frequency so that the phase control signal returns to a normal operating range before the signal reaches an area out of phase synchronization control; and an oscillator control means for controlling the oscillator based on an output signal of the frequency control means and an output signal of the phase synchronization maintaining means.

Therefore, a frequency of an asynchronous clock at reproduction signal sampling can be always maintained within a controllable range of a digital phase-locked loop. Thereby, a smooth digital recorded data reproduction is possible with no discontinuity point occurring at phase synchronization control, and a frequency control and a phase control can be thought separately, resulting in a simple constitution of the control means of an oscillator.

According to claim 18 of the present invention, in a digital recorded data reproducing device as defined in claim 17, the oscillator control means comprises: a delta/sigma modulator for modulating the control signal at up/down control by the phase synchronization maintaining means; and a low pass filter for smoothing the output signal, thereby to control the oscillator by the output signal.

Therefore, in a case where a minimum frequency control resolution of an oscillator is rough, and an oscillation frequency varies vastly at up/down control when a frequency of an asynchronous clock employed for reproduction signal sampling is maintained within a controllable range of a digital phase-locked loop, a modulation is performed in a time direction to control an oscillation frequency of the oscillator with finer resolution than original, whereby there is no disturbance at up/down and a successive reproduction is possible, though there is a risk of disturbance generation in the phase-locked loop, and thus reproduction quality is enhanced.

According to claim 19 of the present invention, a digital recorded data reproducing device as defined in claim 18 further comprises a cut-off frequency varying means for switching a cut-off frequency of the low pass filter according to a reproduction speed of digital recording data.

Therefore, in a case where plural reproduction speeds have to be compensated, or there is a difference between the inner and outer peripheries as well as in a kind of recording medium, so that a broad range of frequency control band is provided when digital recording data are reproduced, response characteristics suitable for each reproduction speed can be realized, whereby reproduction characteristics can be maintained even under the condition that a reproduction speed changes vastly.

According to claim 20 of the present invention, in a digital recorded data reproducing device as defined in any of claims 11, 12, and 17, the offset correction means comprises: an offset detecting means for detecting an offset component held by the sampled signal; a smoothing means for smoothing the detected offset component; and a subtracting means for subtracting the smoothed signal from the sampled signal.

Therefore, the configuration to perform an offset correction can be realized in a device which is capable of performing a stable digital data reproduction that reduces an error rate as well as has high phase-locked pull-in capacity even under such conditions as a characteristic deterioration of a reproduction signal due to tilt and insufficiencies of analog equalization.

According to claim 21 of the present invention, in a digital recorded data reproducing device which comprises: a preamplifier for emphasizing an output amplitude of a reproduction signal from a recording medium; a waveform equalizing means for emphasizing a prescribed frequency band of the emphasized signal; an analog/digital converting means for sampling the equalized signal to a digital data with multiple bits asynchronously with a phase of a clock component included in the signal by a clock generated by an oscillator; an offset correction means for decreasing an offset component from the sampled signal; an automatic gain control means for adjusting the amplitude of the output signal to a required level; a transversal filter for subjecting the signal subjected to the amplitude adjustment to a partial response equalization; a high-order interpolation filter for reproducing a signal in a regulars sampling phase from the signal subjected to the partial response equalization by a high-order interpolation; a tap weighting factor control means for controlling a tap weighting factor of the transversal filter from the interpolation output signal adaptively so that an equalization error is minimum; a phase comparator for detecting a phase error from the interpolation output signal; a loop filter for smoothing the phase error signal; and a maximum likelihood decoder for subjecting the interpolation output signal to a maximum likelihood decoding according to a type of partial response at equalization by the transversal filter so as to perform a data demodulation, the asynchronously sampled signal is subjected to the partial response equalization, and a phase synchronization is compensated by a phase-interpolation-type digital phase-locked loop so that a data demodulation is performed, as well as the offset correction means performs an offset correction with reference to the output of the high-order interpolation filter.

Therefore, an offset detection with higher accuracy than an offset correction only by a polarity of a reproduction signal code can be performed, whereby control noise after offset correction is reduced and a larger feedback gain can be set. Thereby, it is possible to follow a level fluctuation having a higher frequency component, resulting in an enhancement in playability even at reproduction under an abnormal condition such as a defect.

According to claim 22 of the present invention, in a digital recorded data reproducing device as defined in claim 21, the offset correction means comprises: a zero-cross amplitude output means for outputting a component in an amplitude direction with respect to a sampling signal at a position where the output signal of the high-order interpolation filter crosses zero; a polarity value output means for outputting a certain amount of values with different polarity according to a polarity of the signal code with respect to a sampling signal at a position other than the zero-cross position; a loop filter for offset correction for smoothing the output signal of the zero-cross amplitude output means and the output signal of the polarity value output means; and an offset removing means for performing an offset removal by directly subtracting the output signal from the output signal of the analog/digital converter.

Therefore, an offset correction according to a recording medium is possible even when a different recording medium is reproduced.

According to claim 23 of the present invention, in a digital recorded data reproducing device as defined in claim 22, the offset correction means comprises: a polarity value output varying means for varying the output value of the polarity value output means to adjust a ratio of the same to the output value of the zero-cross amplitude output means.

Therefore, the most suitable offset correction according to such states that a control is performed mainly for a code polarity at seek when a followup property to a level fluctuation is required more than accuracy of a reproduction signal, while a control is performed mainly for a zero-cross amplitude at reproduction of successive data when accuracy of a reproduction signal is required, is possible, and further, it involves convergency of control, thereby enabling a high speed phase-locked pull-in after seek.

According to claim 24 of the present invention, in a digital recorded data reproducing device as defined in claim 22, the offset correction means comprises an output value switching means for switching an output value according to an operating state of the digital recorded data reproducing device, by making the output value of the polarity value output means larger than the output value of the zero-cross amplitude output means at seek, and making the output value of the polarity value output means smaller than the output value of the zero-cross amplitude output means at successive data reproduction.

Therefore, a generation of a quasi-phase synchronization is avoided, and, even when the quasi-phase synchronization is generated under certain conditions, an early self-restoring is possible, thereby enhancing playability.

According to claim 25 of the present invention, in a digital recorded data reproducing device as defined in claim 22, the offset correction means comprises: a counter for counting a certain period of time; a cumulative adding means for cumulatively adding the output value of the polarity value output means and the output value of the zero-cross amplitude output means between flags outputted from the counter; and a cumulative adding result monitoring means for monitoring the output signal of the cumulative adding means at a timing of the flag where the output signal is outputted from the counter, and, when being judged as a quasi-phase synchronization state, performing a switching to a control in which a ratio of the polarity value output means is high, so as to restore the state to a normal synchronization state.

Therefore, the configuration to perform an offset correction can be realized in a device which is capable of performing a stable digital data reproduction that reduces an error rate as well as has high phase-locked pull-in capacity even under such conditions as a characteristic deterioration of a reproduction signal due to tilt and insufficiencies of analog equalization.

According to claim 26 of the present invention, in a digital recorded data reproducing device as defined in any of claims 11, 12, 17, and 21, the transversal filter comprises: plural delay elements having delay amount of unit delay time, to which of the first stage the signal subjected to the amplitude adjustment is inputted and which are interconnected in series; an multiplier which is set correspondingly to an input of the delay element of the first stage among the plural unit delay elements as well as outputs of a connection point between delay elements and of a delay element of the last stage; an adder for obtaining the sum total of outputs of the multiplier to generate an output of the filter, wherein a weighting factor inputted to the other input of the multiplier is varied, thereby to realize required equalization characteristics.

Therefore, the configuration to perform a partial response equalization can be realized in a device which is capable of performing a stable digital data reproduction that reduces an error rate as well as has high phase-locked pull-in capacity even under such conditions as a characteristic deterioration of a reproduction signal due to tilt and insufficiencies of analog equalization.

According to claim 27 of the present invention, in a digital recorded data reproducing device as defined in any of claims 11, 17, and 21, the high-order interpolation filter comprises: plural delay elements having delay amount of unit delay time, to which of the first stage the signal subjected to the partial response equalization is inputted and which are interconnected in series; an multiplier which is set correspondingly to an input of the delay element in the first stage among the plural unit delay elements as well as outputs of a connection point between delay elements and of a delay element in the last stage; an adder for obtaining the sum total of outputs of the multiplier to generate an output of the filter, wherein a weighting factor inputted to the other input of the multiplier is varied, thereby to realize required equalization characteristics.

Therefore, the configuration to interpolate a signal in a regular sampling phase can be realized in a device which is capable of performing a stable digital data reproduction that reduces an error rate as well as has high phase-locked pull-in capacity even under such conditions as a characteristic deterioration of a reproduction signal due to tilt and insufficiencies of analog equalization.

According to claim 28 of the present invention, in a digital recorded data reproducing device as defined in claim 27, the high-order interpolation filter performs an interpolation base on Nyquist characteristics.

Therefore, the configuration to interpolate a signal in a regular sampling phase can be realized in a device which is capable of performing a stable digital data reproduction that reduces an error rate as well as has high phase-locked pull-in capacity even under such conditions as a characteristic deterioration of a reproduction signal due to tilt and insufficiencies of analog equalization.

According to claim 29 of the present invention, in a digital recorded data reproducing device as defined in claim 27, the high-order interpolation filter comprises: a register which is set correspondingly to the multiplier and stores each amplitude value when a channel rate of Nyquist characteristics is divided in a time direction; and a selector which is set correspondingly to the register and selects the amplitude value stored in the register to output to the corresponding multiplier according to the output phase information of the loop filter.

Therefore, the configuration to interpolate a signal in a regular sampling phase can be realized in a device which is capable of performing a stable digital data reproduction that reduces an error rate as well as has high phase-locked pull-in capacity even under such conditions as a characteristic deterioration of a reproduction signal due to tilt and insufficiencies of analog equalization.

According to claim 30 of the present invention, in a digital recorded data reproducing device as defined in any of claims 11, 17, and 21, the tap weighting factor control means decides the weighting factor of the transversal filter by Least Mean Square algorithm.

Therefore, the configuration to set a weighting factor so as to realize a function of partial response equalization which should be performed by a transversal filter can be realized in a device which is capable of performing a stable digital data reproduction that reduces an error rate as well as has high phase-locked pull-in capacity even under such conditions as a characteristic deterioration of a reproduction signal due to tilt and insufficiencies of analog equalization.

According to claim 31 of the present invention, in a digital recorded data reproducing device as defined in claim 30, the tap weighting factor control means comprises: a temporary judging circuit for detecting an equalization target value which corresponds to a partial response system based on the output signal of the high-order interpolation filter; an equalization error detector for detecting the equalization error based on the equalization target value and the output signal of the high-order interpolation filter; a correlator for detecting correlation between the equalization error and the output signal of the high-order interpolation filter; a feedback gain regulator for multiplying an output of the correlator by the same number as a gain to regulate a feedback gain; and a tap factor updating part for adding an output of the feedback gain regulator to a weighting factor of each tap to update a tap factor.

Therefore, the configuration to set a weighting factor so as to realize a function of partial response equalization which should be performed by a transversal filter can be realized in a device which is capable of performing a stable digital data reproduction that reduces an error rate as well as has high phase-locked pull-in capacity even under such conditions as a characteristic deterioration of a reproduction signal due to tilt insufficiencies of analog equalization.

According to claim 32 of the present invention, in a digital recorded data reproducing device as defined in claim 15, the frequency error detector comprises: a zero-cross length detector for detecting an interval at which the output signal of the high-order interpolation filter crosses zero level; a synchronization pattern length detector for detecting whether a ratio of neighboring zero-cross lengths coincides with a prescribed synchronization pattern length on the basis of the ratio or not to obtain first cycle information which reflects a reproduction speed of the recording medium; and a synchronization pattern interval detector for detecting an interval until the synchronization pattern is detected to detect second cycle information based on this and a prescribed period.

Therefore, the configuration to detect a frequency error can be realized in a device which is capable of realizing a stable phase-locked loop and preventing a state out of control after the processing shifts from a rough control to a phase synchronization state.

BRIEF DESCRIPTION OF DRAWINGS

FIG. 24 is a diagram illustrating recorded data as well as an output signal waveform at each function block in the conventional optical disk reproducing device.

BEST MODE TO EXECUTE THE INVENTION

Embodiment 1

This first embodiment constitutes a digital phase-locked loop which employs an asynchronous clock for sampling by an analog/digital converter, reproduces a signal in a regular sampling phase, which is subjected to a partial response equalization by a transversal filter, by a high-order interpolation filter, performs a phase error detection based on its output signal, and controls a filter factor of the high-order interpolation filter so as to decrease a phase error.

Hereinafter, the first embodiment which corresponds to a digital recorded data reproducing device as defined in claims 1, 11, 20, and 26 to 32 will be described with reference to FIGS. 1 to 9.

Figure 1:
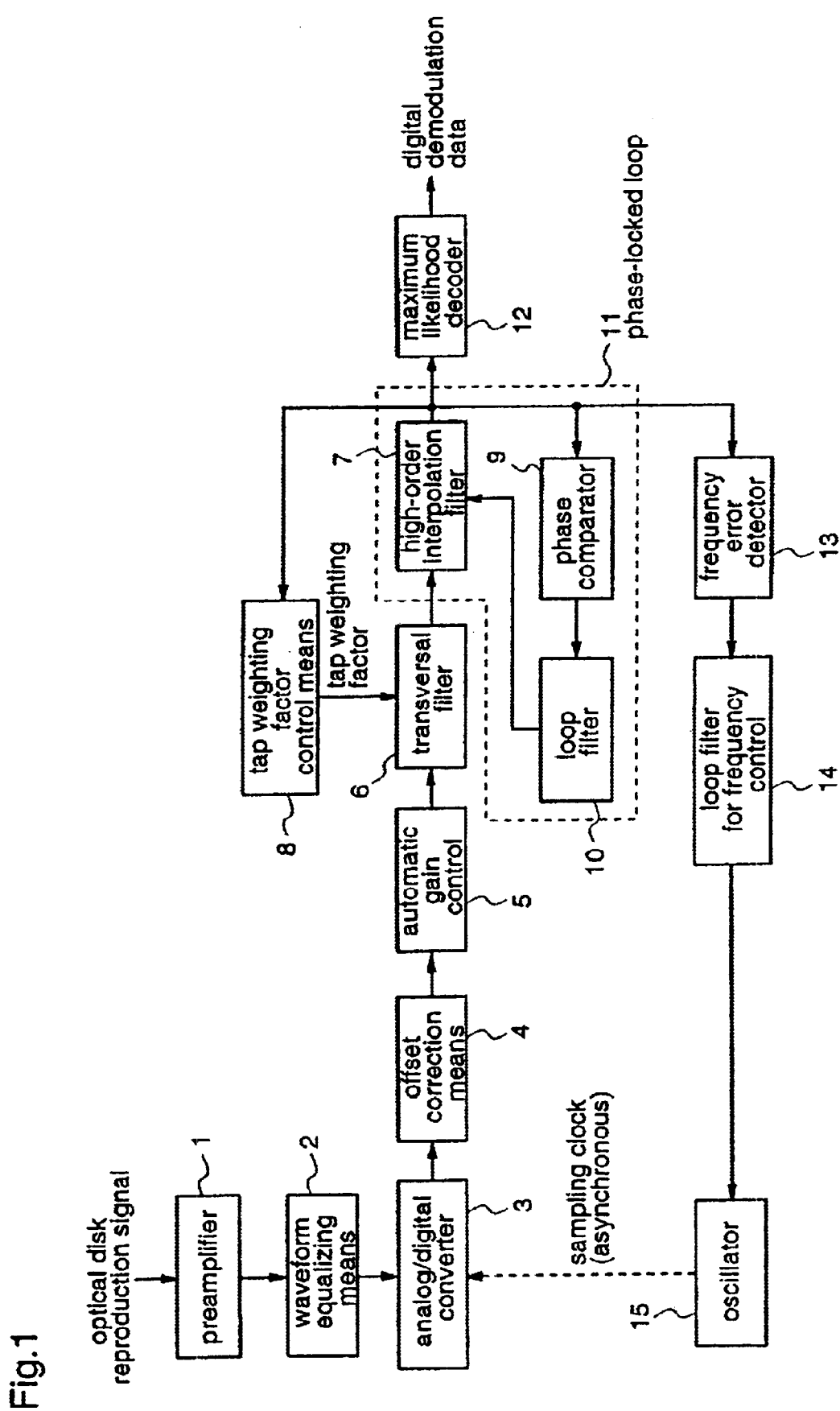
FIG. 1 is a block diagram illustrating a configuration of a digital recorded data reproducing device according to a first embodiment of the present invention.

In FIG. 1, an optical disk reproduction signal obtained by a reproducing means (such as an optical pickup) not shown has its output amplitude emphasized by a preamplifier 1, and is subjected to correction which emphasizes a high frequency by a waveform equalizing means 2 thereafter. The waveform equalizing means 2 comprises a filter such as a high-order equalizing ripple filter, which enables an arbitrary setting of a boost amount and a cut-off frequency, for example. An output signal of the waveform equalizing means 2 is sampled to a digital signal with multiple bits by an analog/digital converter 3 as a means for converting an analog signal to a digital signal. At the time, there is employed a clock which is generated by an oscillator 15 and has a clock component asynchronous with that of the reproduction signal. The digital signal with multiple bits which is sampled by the analog/digital converter 3 is inputted to an offset correction means 4 to correct an offset component included in the reproduction digital signal.

Figure 2:
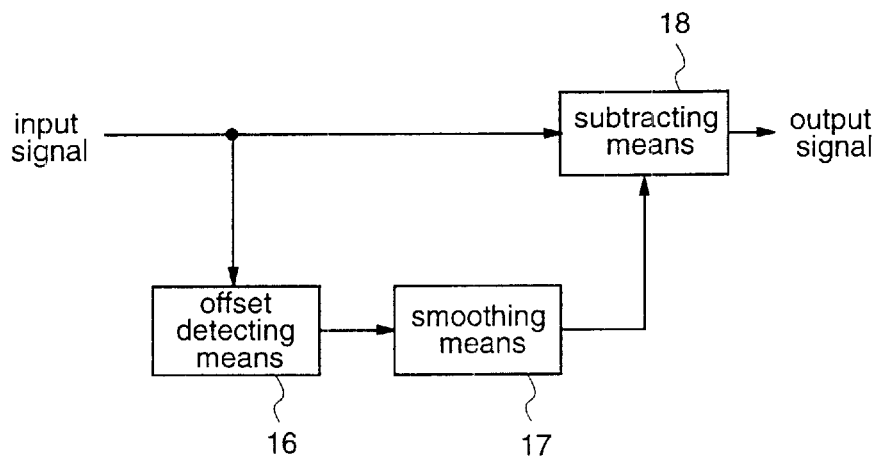
FIG. 2 is a block diagram illustrating a configuration of an offset correction means 4 in the first embodiment.

The offset correction means 4 may be constituted as shown 1in FIG. 2, for example. That in FIG. 2 comprises an offset detecting means 16 for detecting an offset component held by the reproduction digital signal, a smoothing means 17 for smoothing the detected offset signal, and a subtracting means 18 for subtracting an output signal of the smoothing means 17 from the reproduction digital signal.

An output signal of the offset correction means 4 is inputted to an automatic gain control 5, so that an adjustment is made to match an amplitude of the reproduction signal with a required value. The automatic gain control 5 may detect an envelope of a signal waveform and perform a control so that a difference between an arbitrary set value and an envelope signal is zero, for example.

Next, an output signal of the automatic gain control 5 is inputted to a transversal filter 6 and is subjected to a partial response equalization. Here, the partial response equalization employs a PR system (3, 4, 4, 3) which divides a waveform amplitude after equalization into five values (0, 4×A, 7×A, −4×A, −7×A) as shown in FIG. 3(c) in a DVD-ROM (Read only Memory) which is capable of digital recording of 4.7G byte for a layer on a single side, for example.

Figure 3A:
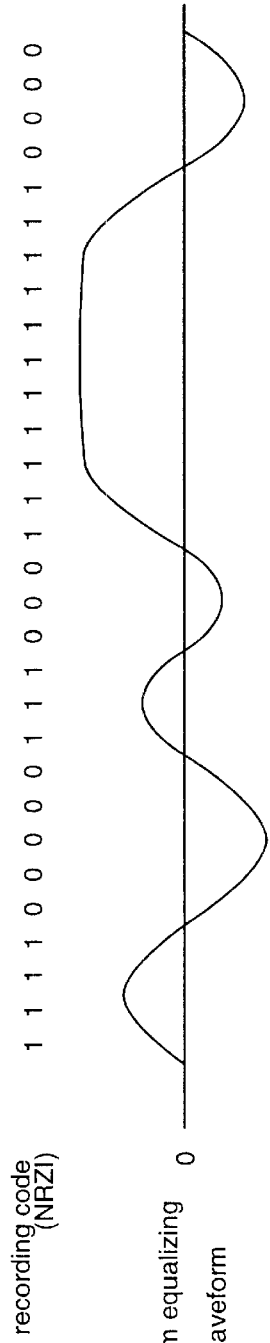
FIG. 3 is a schematic diagram of a difference between PR (3, 4, 4, 3) equalization system which is realized by a transversal filter 6 in the first embodiment and a typical binary discrimination system.
Figure 3B:
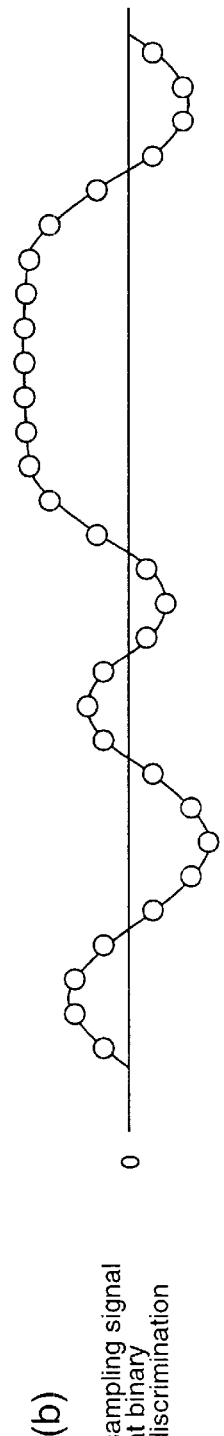
Figure 3C:
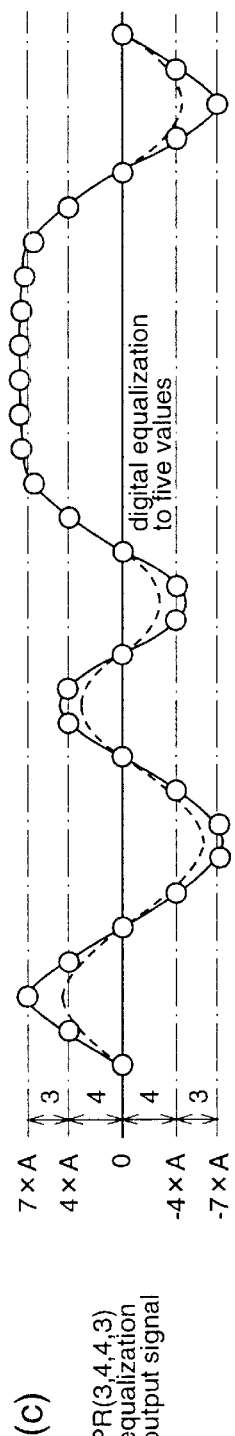

Conventionally, a digital data demodulation was performed from a waveform equalization output signal as shown in FIG. 3(a) by a binary discrimination employing a slice level in a read channel. Also, when sampling is performed, sampling is performed as shown in FIG. 3(b) and its digital signal with multiple bits was subjected to the binary discrimination employing a slice level.

Figure 4:
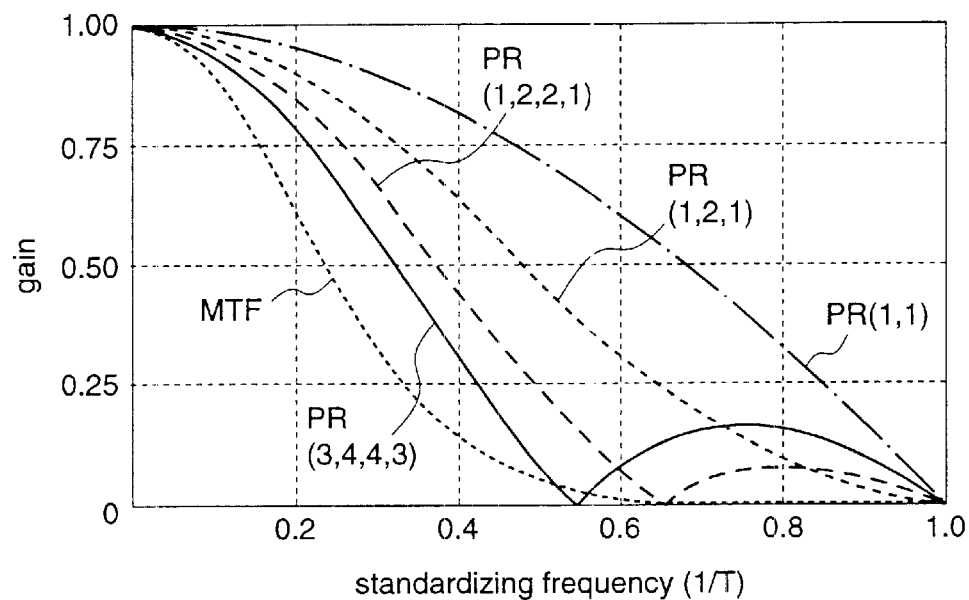
FIG. 4 is a diagram illustrating frequency characteristics of various partial response systems realized by the transversal filter 6 in the first embodiment.

On the contrary, the PR system (3, 4, 4, 3) has characteristics (3+4*D+4*D2+3*D3) of sampling data of four different times added at a rate of 3:4:4:3, and adds characteristics of a low pass filter as shown in FIG. 4 to the reproduction signal.

In FIG. 4, MTF indicates optical reproduction characteristics in a DVD-ROM, and it can be said that the nearer to this frequency characteristics the system is, the more advantageous a partial response system is. There exist diverse types of partial response other than the PR (3, 4, 4, 3) system in addition to the system as shown in FIG. 4, and this is not restricted to a specified system and it makes no difference to employ other systems if only what is equivalent to required performance can be realized. The partial response system which adds a correlativity in a time direction of reproduction data and a viterbi decoder as one of after-mentioned maximum likelihood decoding methods (Maximum Likelihood), which demodulates the most probable series utilizing the added data correlativity, are combined, thereby to realize a PRML signal processing which is considered to be advantageous for a high recording density reproduction in a linear recording direction.

Since the PRML signal processing system has various combinations according to characteristics of reproduced waveform or modulation codes as described above, an appropriate system is required to be selected for various recording reproduction systems. The transversal filter 6 is a FIR (Finite Impulse response Filter) filter constituted by finite taps, for example. Equalization characteristics by the FIR filter can be realized by varying a weighting factor of a tap. A signal subjected to a partial response equalization by the transversal filter 6 is converted to a signal in a regular sampling phase by a high-order interpolation filter 7. The high-order interpolation filter 7 may be based on Nyquist interpolation characteristics as shown in FIG. 5, for example.

Figure 5:
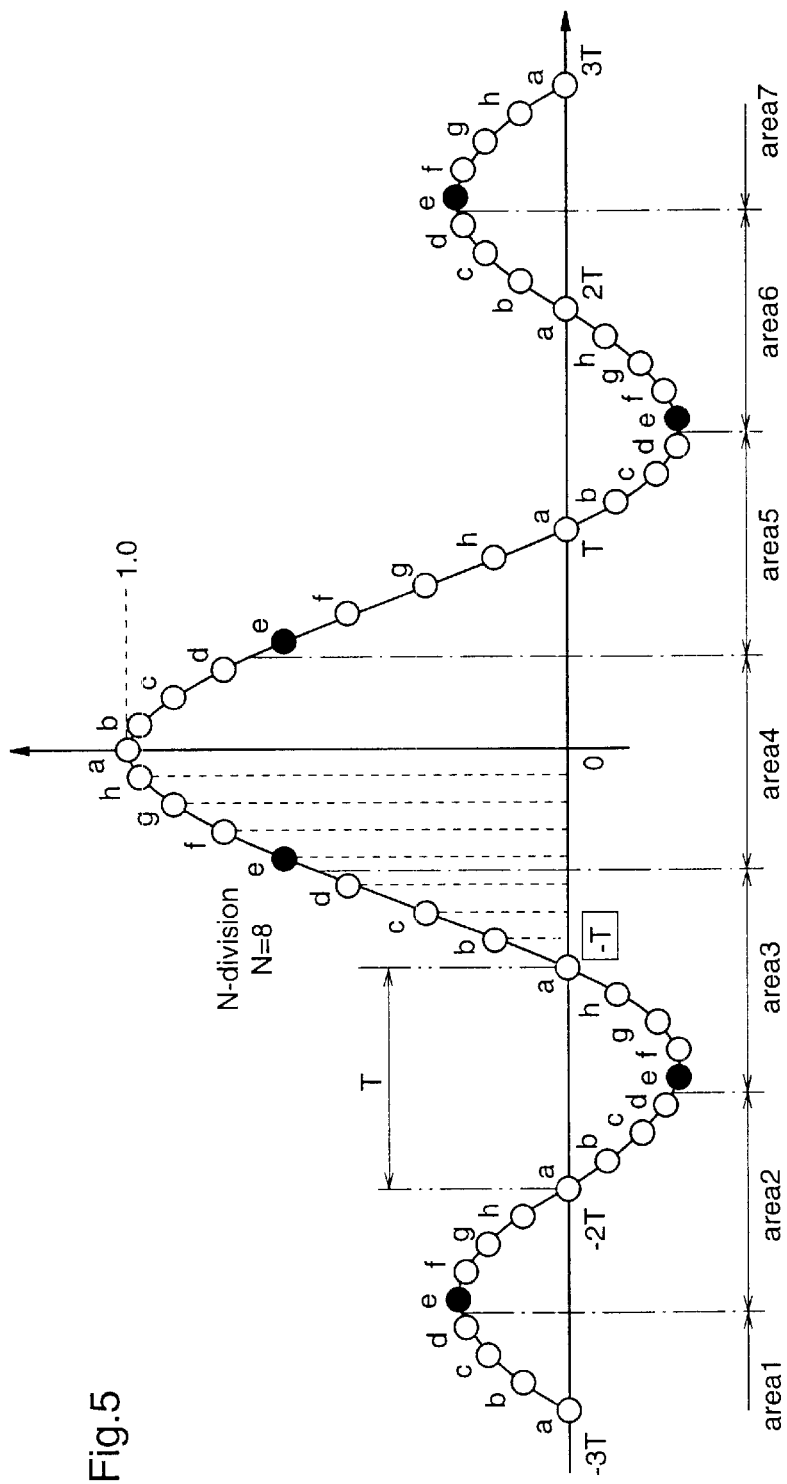
FIG. 5 is a schematic diagram of Nyquist characteristics relevant to a filter factor setting by a high-order interpolation filter 7 in the first embodiment.

In the Nyquist characteristics as shown in FIG. 5, each amplitude value when a channel rate (1T) is divided into N parts in a time direction is stored in a register, and, while the register which performs a selection to set a factor of a phase indicated by phase control information is switched in accordance with the phase control information, a phase interpolation is performed. Thereby, a reproduction signal sampled asynchronously is converted to a reproduction equalization signal equal to a regular sampling phase.

Figure 6A:
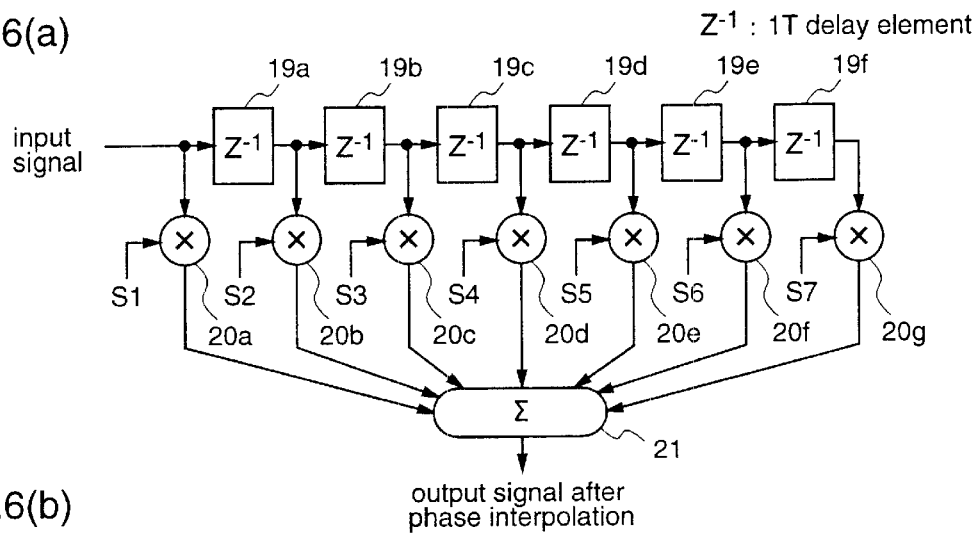
FIG. 6 is a block diagram illustrating a configuration of the high-order interpolation filter 7 in the first embodiment.
Figure 6B:
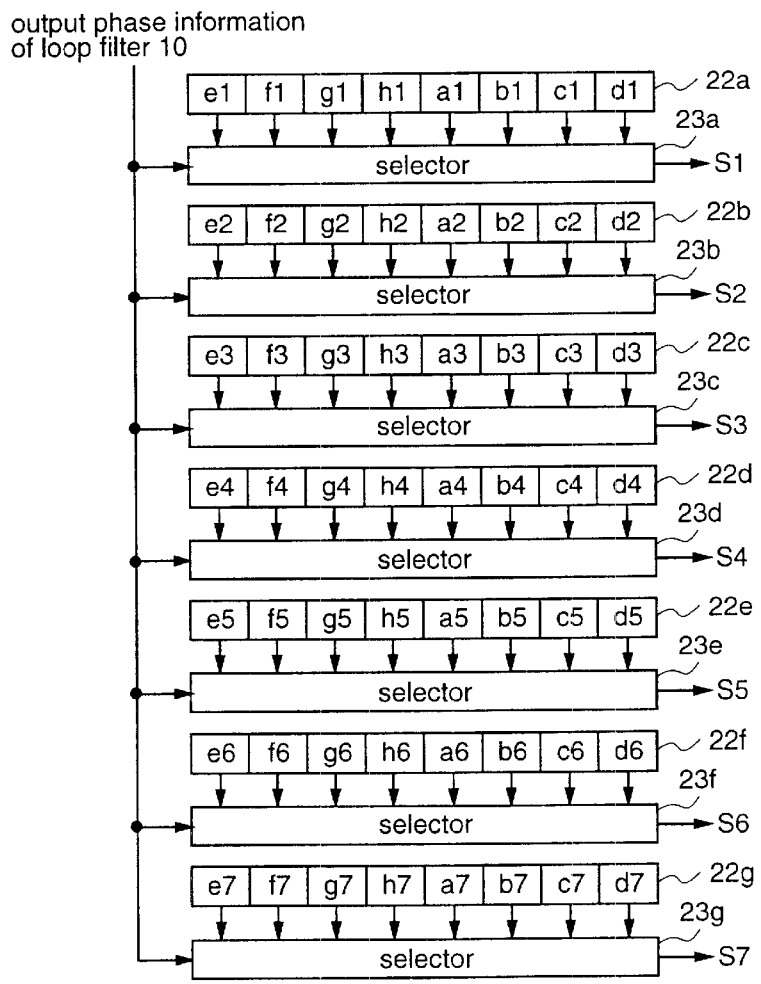

The high-order interpolation filter 7 may be a FIR filter which connects delay elements 19a to 19f in series, and comprises multiplication elements 20a to 20f and 20g which multiply taps extracted from the delay elements, that is, inputs of the delay elements 19a to 19f and an output of the delay element 19f by tap factors S1 to S6 and S7, and an adding means 21 which adds outputs of the multiplication elements 20a to 20f and 20g as shown in FIG. 6.

At this time, when a phase interpolation is performed, while filter factors held in registers 22a to 22g as shown in FIG. 6 are switched by selectors 23a to 23g based on phase control information as an output signal of a loop filter 10, tap factors S1 to S7 are set. Here, the factors of the registers 22a to 22g have Nyquist characteristic value for each phase in FIG. 5 divided into N parts, for example, each channel route T is divided into eight parts from a to h as shown in FIG. 5, and areas from 1 to 7 are previously stored correspondingly to respective taps of the FIR filters shown in FIG. 6. For example, when phase control information at the present moment obtained from the loop filter 10 is a sampling phase different from a regular phase by 180°, filter factors at phases of "●", that is, e in areas from 1 to 7 shown in FIG. 5 are set as tap factors of S1 to S7. The larger the division number N in a time direction is, the higher the accuracy of a phase control becomes, while an increase in the division number N leads to an increase in a circuit scale, and thus the division number is set on condition which allows performance and a circuit scale to be compatible. An output signal of the high-order interpolation filter 7 is inputted to a tap weighting factor control means 8 to control a tap weighting factor of the transversal filter 6 adaptively, so as to minimize an equalization error.

Figure 7:
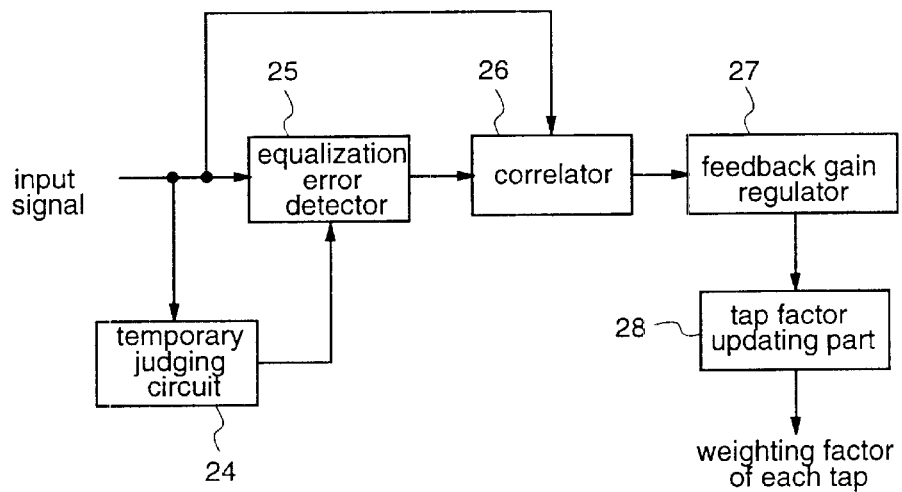
FIG. 7 His a block diagram illustrating a configuration of a tap weighting factor control means 8 in the first embodiment.

The tap weighting factor control means 8 may employ Least Mean Square algorithm as shown in FIG. 7, for example. That is, it comprises an equalization error detector 25 which detects an equalization target value corresponding to the partial response system from the output signal of the high-order interpolation filter 7 by a temporary judging circuit 24, and detects an equalization error by subtracting the equalization target value and the output signal of the high-order interpolation filter 7, a correlator 26 which calculates a correlation between an output signal of the equalization error detector 25 and the output signal of the high-order interpolation filter 7, a feedback gain regulator 27 which multiplies an output of the correlator 26 by the same number as a gain to regulate a feedback gain, and a tap factor updating part 28 which adds the output of the regulator to a weighting factor of each tap to update a tap factor.

Next, a digital phase-locked loop 11 comprises a phase comparator 9 for detecting a phase error from the output signal of the high-order interpolation filter 7, a loop filter 10 for smoothing a phase error signal outputted from the phase comparator 9, and a feedback loop which controls a filter factor of the high-order interpolation filter 7 with the output signal of the loop filter as phase control information.

Figure 8A:
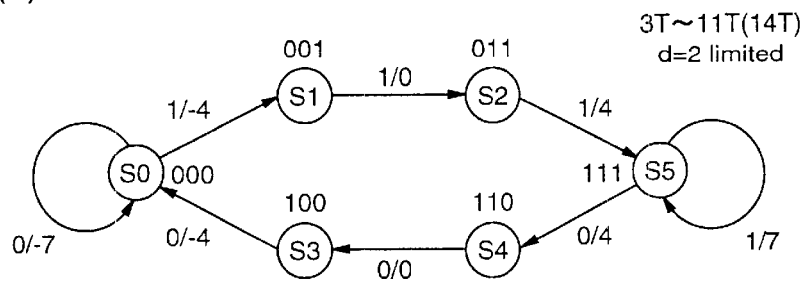
FIG. 8 is a schematic diagram of a principle of a viterbi decoder as one of maximum likelihood decoders 12 in the first embodiment.

A data demodulation is performed through a maximum likelihood decoder 12 which performs decoding according to a type of partial response employing a partial response equalization waveform in a regular phase outputted through a series of the operation. Here, the maximum likelihood decoder 12 may be a viterbi decoder, for example. The viterbi decoder performs a probability calculation according to a law of correlation of an intentionally added code based on a type of partial response so as to reproduce the most probable series. For example, in a case where an applied partial response type is the PR (3, 4, 4, 3) system, a state is changed based on a state transition diagram as shown in FIG. 8(a). This particularly considers an 8-16 modulation code employed for a DVD, also involves limiting a run length to 2, and enables an expression in a transition of six states of reproduced series S0 to S5.

In FIG. 8(a), X/Y is such that X represents a transition of a recording code and Y represents a signal amplitude at the time. A certain state is represented by codes of different three times. For example, in a state transition from S4 "110" to S3 "100", a code "0" is added to "110" to perform shifting to the left, thereby meaning that "1" on the left edge disappears to lead the state S3 "100".

Figure 8B:
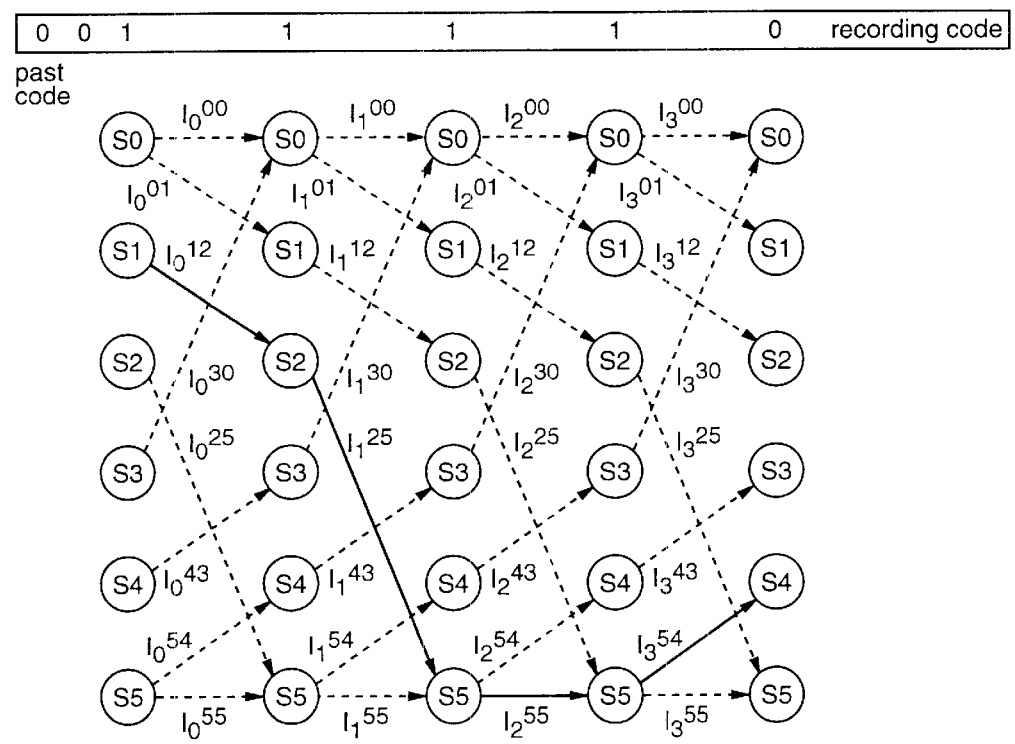

The temporal change is illustrated by a trellis diagram as shown in FIG. 8(b). When a probabilistic length lkab (hereinafter, referred to as "branch metric") of each path is calculated to perform a transition to each state, the branch metric is added. Here, k represents a temporal transition and ab represents a branch metric at a transition from the state Sa to Sb. An additional value in each state of the branch metric is referred to as metric, and a path in which the metric is smallest is outputted sequentially as a survivor path, thereby performing a demodulation to binary digital data. That is, provided that a demodulation is performed according to a recording code in FIG. 8(b), a path indicated in full line is the survivor path.

A means for controlling a sampling clock of the analog/digital converter 3 is realized by a frequency control loop which comprises a frequency error detector 13 as a means for detecting a pattern length of a synchronization pattern or an interval at which the synchronization pattern is generated from the output signal of the high-order interpolation filter 7 to convert to cycle information, thereby outputting a frequency error signal, a loop filter 14 for frequency control as a means for smoothing the frequency error signal outputted from the frequency error detector 13, and an oscillator 15 which supplies a clock to the analog/digital converter 3.

Figure 9:
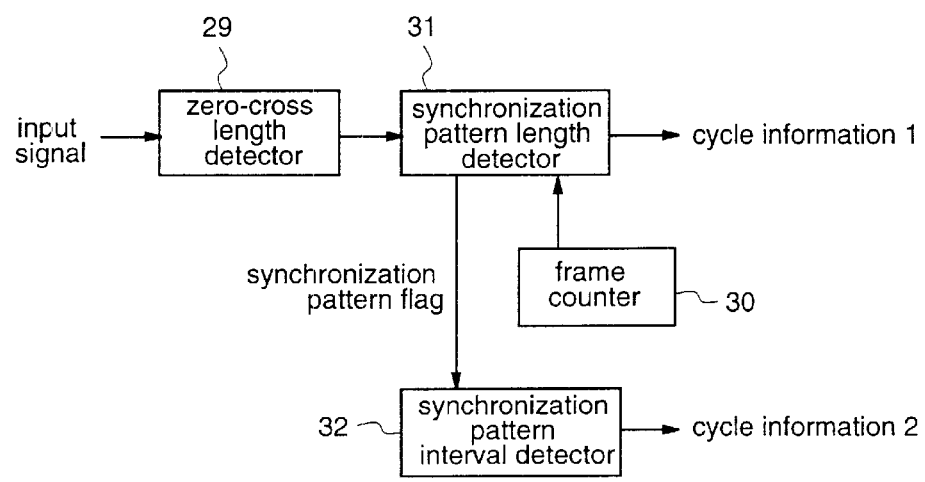
FIG. 9 is a block diagram illustrating a configuration of a frequency error detector 13 in the first embodiment.

The frequency error detector 13 may be constituted as shown in FIG. 9, for example. That is, there is employed an output of a zero-cross length detector 29 which comprises a means for successively detecting a position where a signal crosses zero level from the output signal of the high-order interpolation filter 7 and counting the sampling number between neighboring zero-crosses to hold in a register, and cycle information 1 which is inversely proportional to a linear velocity cycle of reproduction digital data is obtained by a synchronization pattern length detector 31 which comprises a means for detecting a maximum value obtained by adding a count value to hold in a register, only when a ratio of neighboring zero-cross lengths within a period set by a frame counter 30 which comprises a means for counting a specified period over one frame satisfies a ratio of synchronization pattern, such as 14:4 in a EVD-ROM. After being pulled in to some extent by a synchronization pattern length, in order to make a frequency closer to a frequency of a clock component held by the reproduction clock, a cycle where synchronization pattern is generated is detected by a synchronization pattern interval detector 32 which comprises a means for outputting a synchronization pattern flag at a position judged to be a synchronization pattern by the synchronization pattern length detector 31 and counting an interval until a synchronization pattern flag is detected next, and a difference from 1448T (T represents 1 channel bit here) in a DVD-ROM, for example, is obtained as cycle information 2. An oscillation clock of the oscillator 15 is controlled to a frequency domain where a phase synchronization is possible by the cycle information 1 and the cycle information 2.

The digital recorded data reproducing device which subjects a signal sampled asynchronously to a partial response equalization, compensates a phase synchronization by a phase interpolation type digital phase-locked loop, and performs a data demodulation is employed, and phase error information is detected after partial response equalization, so that a decrease of jitter in the phase-locked loop as well as the most suitable partial response equalization signal can be reproduced, even under such conditions as the characteristic deterioration of a reproduction signal due to tilt and insufficiencies of analog equalization, thereby reducing an error rate as well as enabling a stable digital recorded data reproduction with high phase-locked pull-in capacity.

That is, the digital recorded data reproducing device which subjects an asynchronously sampled signal to a partial response equalization, compensates a phase synchronization by a phase interpolation type digital phase-locked loop, and performs a data demodulation is employed, and phase error information is detected after partial response equalization, so that a decrease of jitter in the phase-locked loop as well as the most suitable partial response equalization signal can be reproduced, even under such conditions as the characteristic deterioration of a reproduction signal due to tilt and insufficiencies of analog equalization, resulting in a digital recorded data reproducing device which reduces an error rate as well as enables a stable digital recorded data reproduction with high phase-locked pull-in capacity.

Embodiment 2

Hereinafter, a second embodiment which corresponds to a digital recorded data reproducing device as defined in claims 2, 12 to 16, 20, 26, and 32 will be described with reference to FIGS. 10 to 12.

Figure 10:
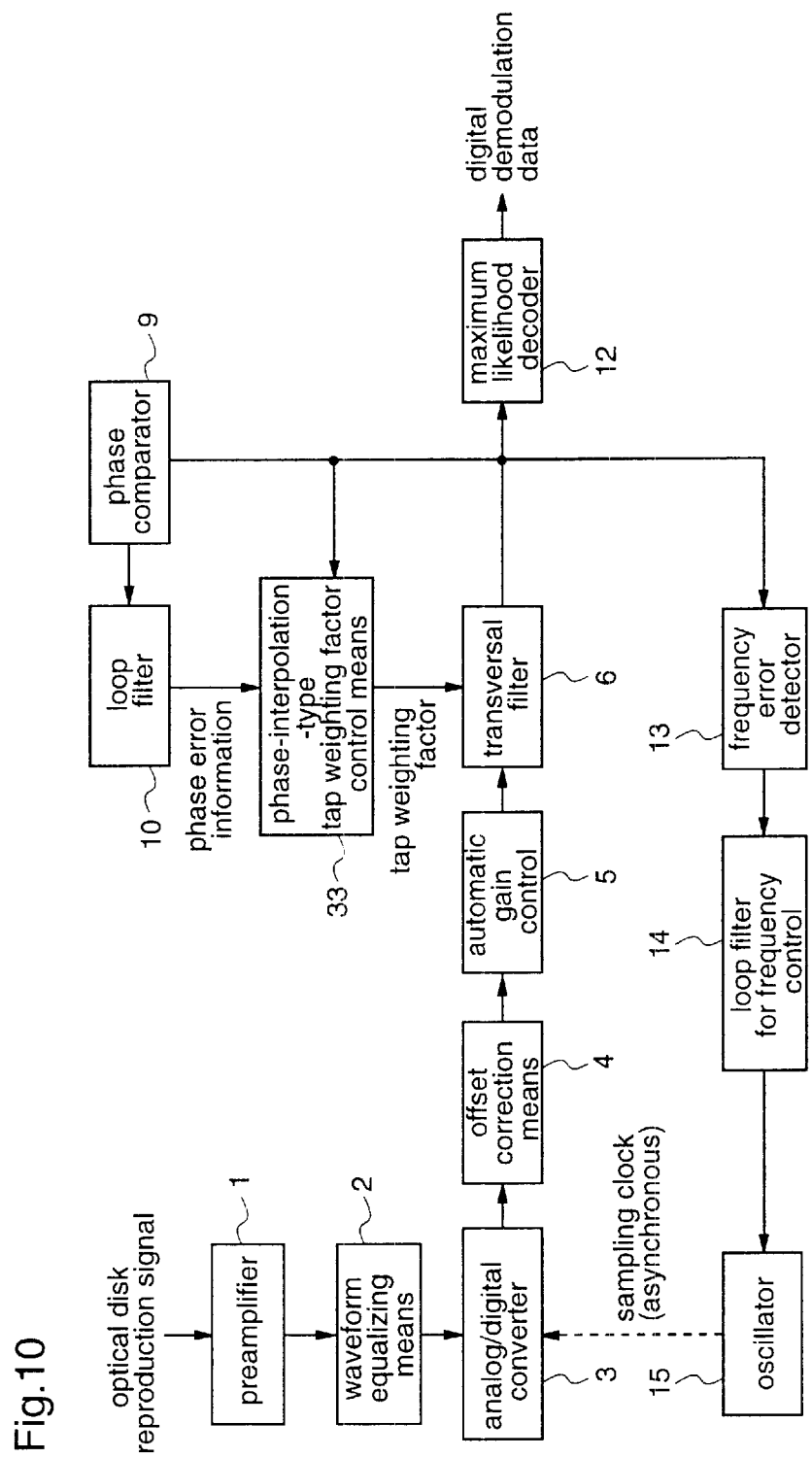
FIG. 10 is a block diagram illustrating a configuration of a digital recorded data reproducing device according to a second embodiment of the present invention.

In FIG. 10, an optical disk reproduction signal obtained by a reproducing means (such as an optical pickup) not shown has its output amplitude emphasized by a preamplifier 1, and is subjected to correction which emphasizes a high frequency by a waveform equalizing means 2 thereafter. The waveform equalizing means 2 comprises a filter such as a high-order equalizing ripple filter, which enables an arbitrary setting of a boost amount and a cut-off frequency, for example. An output signal of the waveform equalizing means 2 is sampled to a digital signal with multiple bits by an analog/digital converter 3 as a means for converting an analog signal to a digital signal. At the time, there is employed a clock which is generated by an oscillator 15 and has a clock component asynchronous with that of the reproduction signal. The digital signal with multiple bits which is sampled by the analog/digital converter 3 is inputted to an offset correction means 4 to correct an offset component included in the reproduction digital signal.

The offset correction means 4 may be constituted as shown in FIG. 2, for example. That is, it comprises an offset detecting means 16 for detecting an offset component held by the reproduction digital signal, a smoothing means 17 for smoothing the detected offset signal, and a subtracting means 18 for subtracting an output signal of the smoothing means 17 from the reproduction digital signal.

An output signal of the offset correction means 4 is inputted to an automatic gain control 5, so that an amplitude of the reproduction digital signal is adjusted to an arbitrary value. The automatic gain control 5 may detect an envelope of a signal waveform and perform a control so that a difference between an arbitrary set value and an envelope signal is zero, for example.

Next, an output signal of the automatic gain control 5 is inputted to a transversal filter 6 and is subjected to a phase interpolation to realize a phase synchronization and a partial response equalization. Here, the partial response equalization may employ the PR system (3, 4, 4, 3) as described in the first embodiment.

The transversal filter 6, which is constituted by finite taps, may be a FIR (Finite Impulse response Filter) filter as shown in FIG. 6, for example. Equalization characteristics and phase interpolation characteristics by the FIR filter can be realized by varying a weighting factor of a tap. A phase-interpolation-type tap weighting factor control means 33 is provided as a means for controlling the weighting factor of a tap. That is, the transversal filter 6 is controlled by two kinds of control loops, that is, an adaptive control loop which comprises the phase-interpolation-type tap, weighting factor control means 33 as a means for controlling the weighting factor of a tap so as to minimize a partial response equalization error on the basis of an equalization output signal, and a digital phase-locked loop as a means which comprises a phase comparator 9 for detecting a phase error of the output of the transversal filter 6, a loop filter 10 for smoothing a phase error signal outputted from the phase comparator 9, and the phase-interpolation-type tap weighting factor control means 33, and controls a filter factor of the phase-interpolation-type tap weighting factor control means 33 with an output signal of the loop filter 10 as phase control information.

A data demodulation is performed through a maximum likelihood decoder 12 which performs decoding according to a type of partial response employing a partial response equalization waveform in a regular phase outputted through a series of the operation. Here, the maximum likelihood decoder 12 may be a viterbi decoder, for example. The viterbi decoder performs a probability calculation according to a law of correlation of an intentionally added code based on a type of partial response so as to reproduce the most probable series. For example, a PR (3, 4, 4, 3) ML system, that is, PRML system with an applied partial response type being PR (3, 4, 4, 3) is possible.

Figure 11:
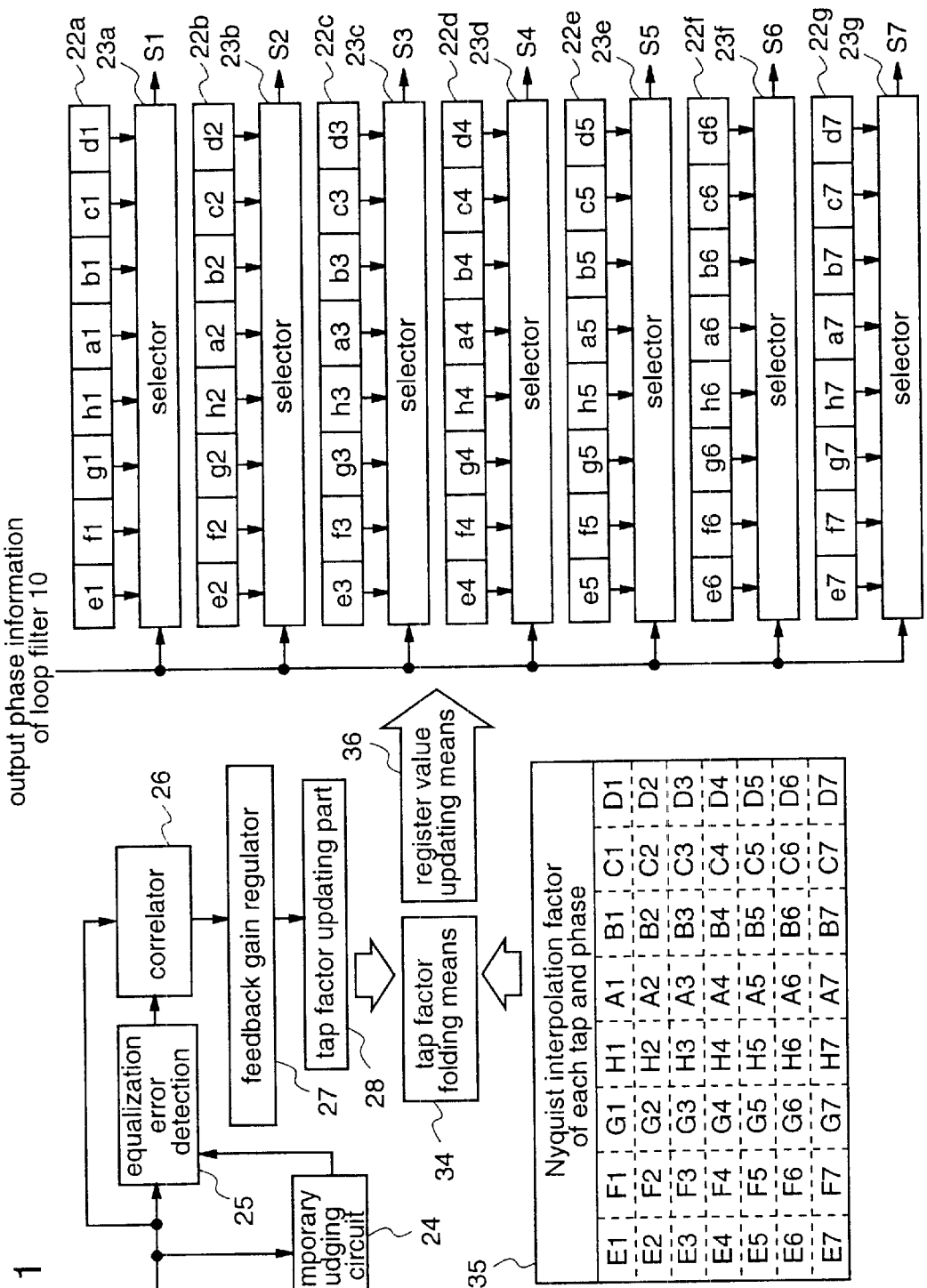
FIG. 11 is a block diagram illustrating a configuration of a phase interpolation type tap weighting factor control means 33 in the second embodiment.

The phase-interpolation-type tap weighting factor control means 33 may be constituted as shown in FIG. 11. That is, when a phase interpolation control is performed, while filter factors held in registers 22a–22g as shown in FIG. 11 are switched by selectors 23a–23g based on the phase control information as the output signal of the loop filter 10, the respective tap factors of FIR filters S1–S7 as shown in FIG. 6 are set. Here, the factors of registers 22a–22g are decided by both of a factor control by partial response adaptive automatic equalization and a factor control by Nyquist phase interpolation control.

A factor control by the partial response adaptive automatic equalization may employ Least Mean square algorithm as shown in FIG. 11, for example. That is, it comprises an equalization error detector 25 which detects an equalization target value corresponding to the partial response system from In the output signal of the transversal filter 6 by a temporary judging circuit 24, and detects an equalization error by subtracting the equalization target value and the output signal of the transversal filter 6, a correlator 26 which calculates a correlation between an output signal of the equalization error detector 25 and the output signal of the transversal filter 6, a feedback gain regulator 27 as a means for multiplying an output of the correlator 26 by the same number as a gain to regulate a feedback gain, and a tap factor updating part 28 as a means for adding the output of the regulator to a weighting factor of each tap to update a tap factor.

On the other hand, a factor control by the Nyquist phase interpolation control divides Nyquist characteristics into eight parts from a to h as shown in FIG. 5, for example, and stores areas from 1 to 7 in a register 35 correspondingly to the respective taps of the FIR filters shown in FIG. 6. Nyquist interpolation factors at each tap and phase Em-Dm (m corresponds to a tap number and an area number) which are stored in the register 35 in FIG. 11 and a tap weighting factor for partial response equalization which is an output signal of the tap factor updating part 28 are superimposed by a tap factor folding means 34, and each register value of registers 22a to 22g is updated by a register value updating means 36, thereby setting a tap weighting factor which satisfies both of the factor control by the partial response adaptive automatic equalization and the factor control by the Nyquist phase interpolation control.

A means for controlling a sampling clock of the analog/digital converter 3 is realized by a frequency control loop which comprises a frequency error detector 13 as a means for detecting a pattern length of a synchronization pattern or an interval at which the synchronization pattern is generated from the output signal of the transversal filter 6 to convert to cycle information, thereby outputting a frequency error signal, a loop filter 14 for frequency control as a means for smoothing the frequency error signal outputted from the frequency error detector 13, and an oscillator 15 which supplies a clock to the analog/digital converter 3.

Here the frequency error detector 13 may be constituted as shown in FIG. 9, for example. That is, there is employed an output of a zero-cross length detector 29 which comprises a means for successively detecting a position where a signal crosses zero level from the output signal of the transversal filter 6 and counting the sampling number between neighboring zero-crosses to hold in a register, and cycle information 1 which is inversely proportional to a linear velocity cycle of reproduction digital data is obtained by a synchronization pattern length detector 31 which comprises a means for detecting a maximum value obtained by adding a count value to hold in a register, only when a ratio of neighboring zero-cross lengths within a period set by a frame counter 30 which comprises a means for counting a specified period over one frame satisfies a ratio of synchronization pattern, such as 14:4 in a DVD-ROM. After being pulled in to some extent by a synchronization pattern length, in order to make a frequency closer to a frequency of a clock component held by the reproduction clock, a cycle where synchronization pattern is generated is detected by a synchronization pattern interval detector 32 which comprises a means for outputting a synchronization pattern flag at a position judged to be a synchronization pattern by the synchronization pattern length detector 31 and counting an interval until a synchronization pattern flag is detected next, and a difference from 1448T (T represents 1 channel bit here) in a DVD-ROM, for example, is obtained as cycle information 2. An oscillation clock of the oscillator 15 is controlled to a frequency domain where a phase synchronization is possible by the cycle information 1 and the cycle information 2.

The digital recorded data reproducing device which subjects an asynchronously sampled signal to a partial response equalization by a single system transversal filter, realizes a phase interpolation type digital phase-locked loop, and performs a data demodulation is employed, so that the transversal filter and a high-order interpolation filter which make up a great portion in the whole as a circuit scale can be communized, thereby realizing a reduction in circuit scale and particularly low power consumption at high speed reproduction, as well as enabling an effective control with high accuracy without losing both characteristics of partial response equalization and data reproduction interpolation in a regular sampling phase by being constructed so as to operate a means for setting a filter factor for phase control and a means for setting a tap weighting factor for partial response equalization individually. Further, two kinds of control loops in the first embodiment are integrated to communize the transversal filter and the high-order interpolation filter which make up a great portion as a circuit scale, thereby realizing a reduction in circuit scale and particularly low power consumption at high speed reproduction.

Figure 12:
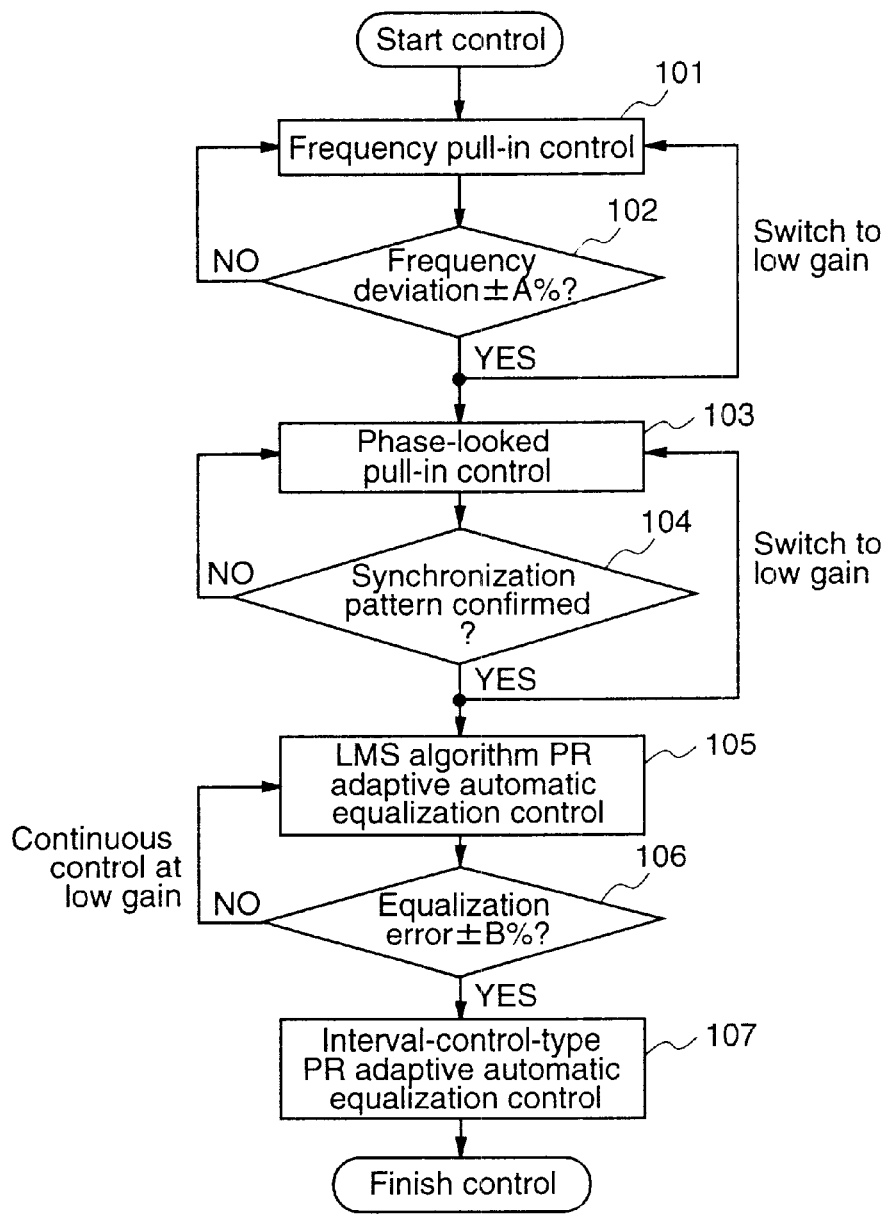
FIG. 12 is a flow chart illustrating a method of frequency control, phase synchronization control, and LMS adaptive automatic equalization control in the second embodiment.

Further, a method of frequency control, phase synchronization control, and partial response adaptive automatic control may be one as shown in a flow chart in FIG. 12. When a control is started, a frequency pull-in is performed by a frequency control loop as a first stage (Step 101). When a deviation amount of a frequency of a clock component held by a reproduction signal, which is obtained as the result, and a clock frequency generated by the oscillator 15 are within ±A% (Step 102), the processing shifts to a phase synchronization pull-in control as a second stage (Step 103), and a loop gain at frequency pull-in is switched to a low gain mode. When the frequency deviation amount is not within ±A%, the frequency pull-in control is continued.

In a case where the processing shifts to the phase synchronization pull-in control as the second stage, when a synchronization pattern detected as the result is confirmed continuously for a certain number (Step 104), the processing shifts to a LMS algorithm PR adaptive automatic equalization control as a third stage (Step 105), and a loop gain at phase synchronization pull-in is switched to a low gain mode. When the synchronization pattern is not confirmed continuously for a certain number, the phase synchronization pull-in control is continued. In a case where the processing shifts to the LMS algorithm PR adaptive automatic equalization control as the third stage, when an equalization error obtained as the result is within ±B % (Step 106), the processing shifts to an interval-control-type PR adaptive automatic equalization control as a fourth stage, while the LMS algorithm PR adaptive automatic equalization control is performed in a low gain mode continuously when the result is not within ±B % (Step 107). Here, the interval-control-type PR adaptive automatic equalization control is a control method which reflects an accumulated additional value of an equalization error amount which has a correlativity in each tap in a certain period of time discretely on a tap weighting factor, instead of successively feeding back a tap weighting factor for partial response equalization. Here a loop gain of the LMS algorithm PR adaptive automatic equalization control and the interval-control-type PR adaptive automatic equalization control is preferably low enough against the loop gain of the phase synchronization pull-in control, so that no competition occurs, thereby enabling a stable control.

By a series of the control method, a competition between the control of a filter factor for phase control and the control of a tap weighting factor for partial response adaptive automatic equalization are prevented and a phase control is given priority to, thereby realizing a stable phase-locked loop as well as enabling a control which does not lose an accuracy of the partial response equalization. Further, by employing the interval control, it is possible to avoid a state out of control even when an abnormal signal is generated, thereby obtaining a digital recorded data reproducing device which also enhances playability.

Embodiment 3

Hereinafter, a third embodiment which corresponds to a digital recorded data reproducing device as defined in claims 3 to 5, 17 to 20, and 26 to 31 will be described with reference to FIGS. 13 to 16.

Figure 13:
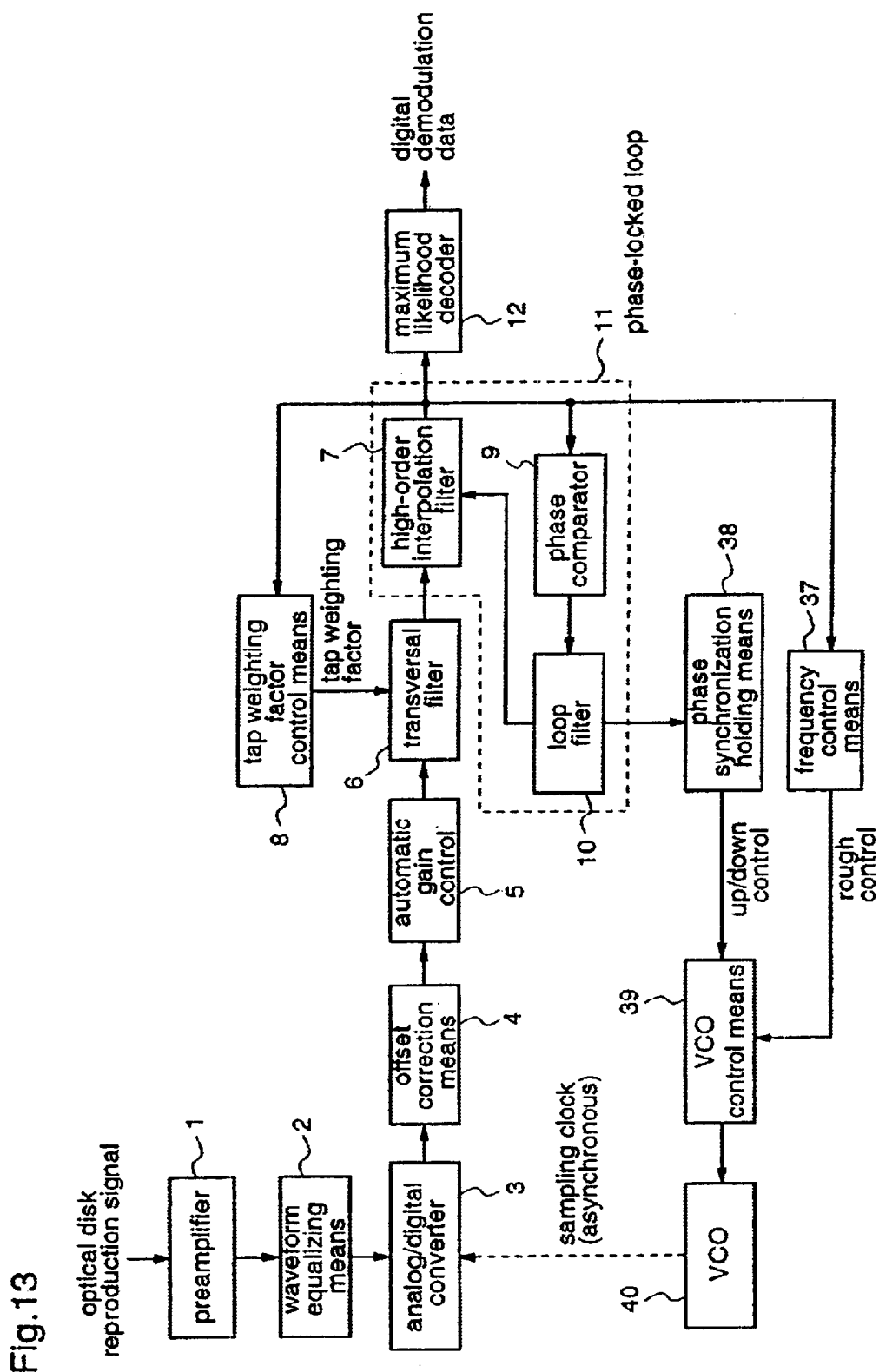
FIG. 13 is a block diagram illustrating a configuration of a digital recorded data reproducing device according to a third embodiment of the present invention.

In FIG. 13, an optical disk reproduction signal obtained by a reproducing means (such as an optical pickup) not shown has its output amplitude emphasized by a preamplifier 1, and is subjected to correction which emphasizes a high frequency by a waveform equalizing means 2 thereafter. The waveform equalizing means 2 comprises a filter which enables an arbitrary setting of a boost amount and a cut-off frequency. For example, this is a high-order equalizing ripple filter or the like. An output signal of the waveform equalizing means 2 is sampled to a digital signal with multiple bits by an analog/digital converter 3 as a means for converting an analog signal to a digital signal. At the time, there is employed a clock which is generated by a VCO 40 and has a clock component asynchronous with that of the reproduction signal. The sampled digital signal with multiple bits is inputted to an offset correction means 4 to correct an offset component included in the reproduction digital signal.

The offset correction means 4 may be constituted as shown in FIG. 2, for example. That is, it comprises an offset detecting means 16 for detecting an offset component held by the reproduction digital signal, a smoothing means 17 for smoothing the detected offset signal, and a subtracting means 18 for subtracting an output signal of the smoothing means 17 from the reproduction digital signal.

An output signal of the offset correction means 4 is inputted to an automatic gain control 5, so that an amplitude of the reproduction signal is adjusted to an arbitrary value. The automatic gain control 5 may detect an envelope of a signal waveform and perform a control so that a difference between an arbitrary set value and an envelope signal is zero, for example.

Next, an output signal of the automatic gain control 5 is inputted to a transversal filter 6 and is subjected to a partial response equalization. Here, the partial response equalization employs a PR system (3, 4, 4, 3) which divides a waveform amplitude after equalization into five values (0, 4×A, 7×A, −4×A, −7 ×A) as shown in FIG. 3(c) in a DVD-ROM (Read Only Memory) which is capable of digital recording of 4.7G byte for a layer on a single side, for example. There exist diverse types of partial response other than the PR (3, 4, 4, 3) system, and it is not restricted to a specified system and it makes no difference to employ other systems if only what is equivalent to performance is possible. The partial response system which adds a correlativity in a time direction of reproduction data and a viterbi decoder as one of after-mentioned maximum likelihood decoding methods (Maximum Likelihood), which demodulates the most probable series utilizing the added data correlativity, are combined, thereby to realize a PRML signal processing which is considered to be advantageous for a high recording density reduction in a linear recording direction.

Since the PRML signal processing system has various combinations according to characteristics of reproduced waveform or modulation codes as described above, an appropriate system is required to be selected for various recording reproduction systems. The transversal filter 6 is a FIR (Finite Impulse response Filter) filter constituted by finite taps, for example. Equalization characteristics by the FIR filter can be realized by varying a weighting factor of a tap. A signal subjected to a partial response equalization by the transversal filter 6 is converted to a signal in a regular sampling phase by a high-order interpolation filter 7.

The high-order interpolation filter 7 may be based on Nyquist interpolation characteristics as shown in FIG. 5, for example. In the Nyquist characteristics as shown in FIG. 5, each amplitude value when a channel rate (1T) is divided into N parts in a time direction is stored in a register, and, while the register which performs a selection to set a factor of a phase indicated by phase control information is switched in accordance with the phase control information, a phase interpolation is performed. Thereby, a reproduction signal sampled asynchronously is converted to a reproduction equalization signal equal to a regular sampling phase.

The high-order interpolation filter 7 may be a FIR filter which comprises delay elements 19a–19f, multiplication elements 20a–20g, and an adding means 21.

At this time, when a phase interpolation is performed, while filter factors held in registers 22a to 22g as shown in FIG. 6 are switched by selectors 23a to 23g based on phase control information as an output signal of a loop filter 10, tap factors S1 to S7 are set. Here, the factors of the registers 22a to 22g have Nyquist characteristic value for each phase in FIG. 5 divided into N parts, such as eight parts from a to h as shown in FIG. 5, for example, and areas from 1 to 7 are stored correspondingly to respective taps of the FIR filters shown in FIG. 6. For example, when phase control information at the present moment obtained from the loop filter 10 is a sampling phase different from a regular phase by 180°, filter factors at phases of "●", that is, e in areas from 1 to 7 shown in FIG. 5 are set as tap factors of S1 to S7. The larger the division number N in a time direction is, the higher the accuracy of a phase control becomes, while an increase in the division number N leads to an increase in a circuit scale, and thus the division number is set on condition which allows performance and a circuit scale to be compatible. An output signal of the high-order interpolation filter 7 is inputted to a tap weighting factor control means 8 to control a tap weighting factor of the transversal filter 6 adaptively, so as to minimize an equalization error.

The tap weighting factor control means 8 may employ Least Mean Square algorithm as shown in FIG. 7, for example. That is, it comprises an equalization error detector 25 which detects an equalization target value corresponding to the partial response system from the output signal of the high-order interpolation filter 7 by a temporary judging circuit 24, and detects an equalization error by subtracting the equalization target value and the output signal of the high-order interpolation filter 7, a correlator 26 which calculates a correlation between an output signal of the equalization error detector 25 and the output signal of the high-order interpolation filter 7, a feedback gain regulator 27 as a means for multiplying an output of the correlator 26 by the same number as a gain to regulate a feedback gain, and a tap factor updating part 28 as a means for adding the output of the regulator to a weighting factor of each tap to update a tap factor.

Next, a digital phase-locked loop 11 comprises a phase comparator 9 for detecting a phase error from the output signal of the high-order interpolation filter 7, a loop filter 10 for smoothing a phase error signal outputted from the phase comparator 9, and a feedback loop which controls a filter factor of the high-order interpolation filter 7 with the output signal of the loop filter as phase control information.

A data demodulation is performed through a maximum likelihood decoder 12 which performs decoding according to a type of partial response employing a partial response equalization waveform in a regular phase outputted through a series of the operation. Here, the maximum likelihood decoder 12 may be a viterbi decoder, for example. The viterbi decoder performs a probability calculation according to a law of correlation of an intentionally added code in accordance with a type of partial response so as to reproduce the most probable series.

A means for controlling a sampling clock of the analog/digital converter 3 is realized by a frequency control loop which comprises a frequency error detector 13 as a means for detecting a pattern length of a synchronization pattern or an interval at which the synchronization pattern is generated from the output signal of the high-order interpolation filter 7 to convert to cycle information, thereby outputting a frequency error signal, a frequency control means 37 which performs a rough frequency control, comprising a loop filter 14 for frequency control as a means for smoothing the frequency error signal outputted from the frequency error detector 13, a phase synchronization maintaining means 38 which monitors the phase control information outputted from the loop filter 10 after the frequency and a frequency of a clock component included in the reproduction signal are pulled in to the neighborhood, and performs an up/down control of the clock frequency so that a phase control signal returns to a normal operating range before it reaches an area out of phase synchronization control, and a VCO control means 39 which controls an oscillation frequency of the VCO 40 that supplies a clock to the analog/digital converter 3 based on a rough control signal of the frequency and an up/down control signal.

The frequency control means 37 may be one which connects the loop filter 14 for frequency control to the constitution as shown in FIG. 9, for example. That is, there is employed an output of a zero-cross length detector 29 which comprises means for successively detecting a position where a signal crosses zero level from the output signal of the high-order interpolation filter 7 and counting the sampling number between neighboring zero-crosses to hold in a register, and cycle information 1 which is inversely proportional to a linear velocity cycle of reproduction digital data is obtained by a synchronization pattern length detector 31 which comprises a means for detecting a maximum value obtained by adding a counting value to hold in a register, only when a ratio of neighboring zero-cross lengths within a period set by a frame counter 30 which comprises a means for count a specified period over one frame satisfies a ratio of synchronization pattern, such as 14:4 in a DVD-ROM. After being pulled in to some extent by a synchronization pattern length, in order to make a frequency closer to a frequency of a clock component held by the reproduction clock, a cycle where synchronization pattern is generated is detected by a synchronization pattern interval detector 32 which comprises means for outputting a synchronization pattern flag at a position judged to be a synchronization pattern by the synchronization pattern length detector 31 and counting an interval until a synchronization pattern flag is detected next, and a difference from 1448T (T represents 1 channel bit here) in a DVD-ROM, for example, is obtained as cycle information 2. An oscillation clock of the VCO 40 is controlled to a frequency domain where a phase synchronization is possible through the loop filter 14 for frequency control.

Figure 14A:
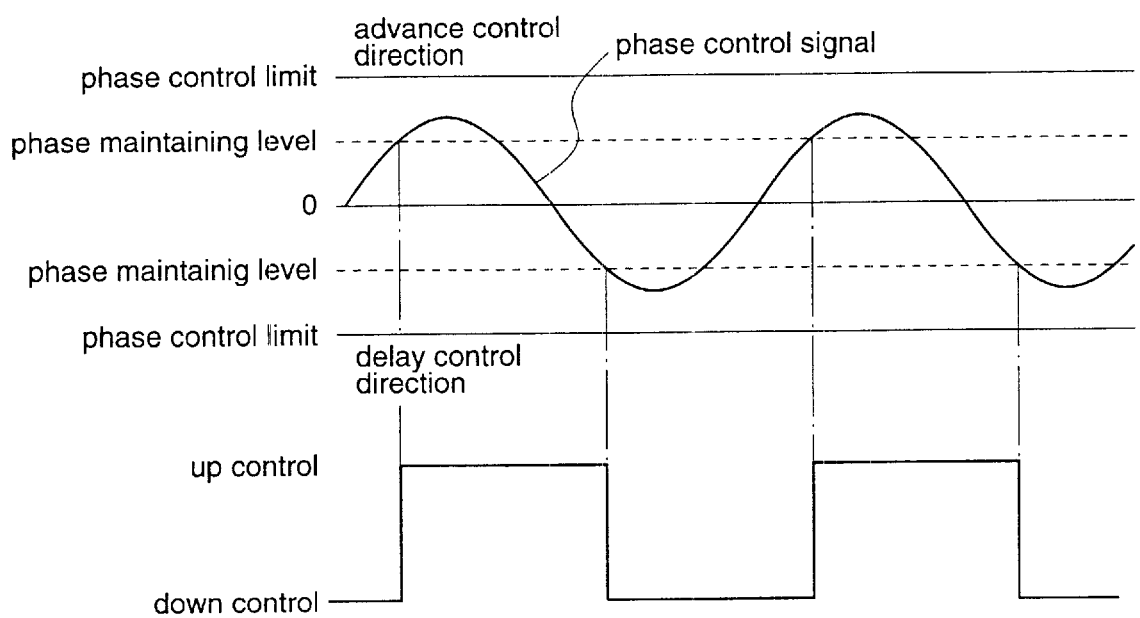
FIG. 14 is a schematic diagram of an operation principle of a phase synchronization maintaining means 38 and of a VCO control means 39 in the third embodiment.
Figure 14B:
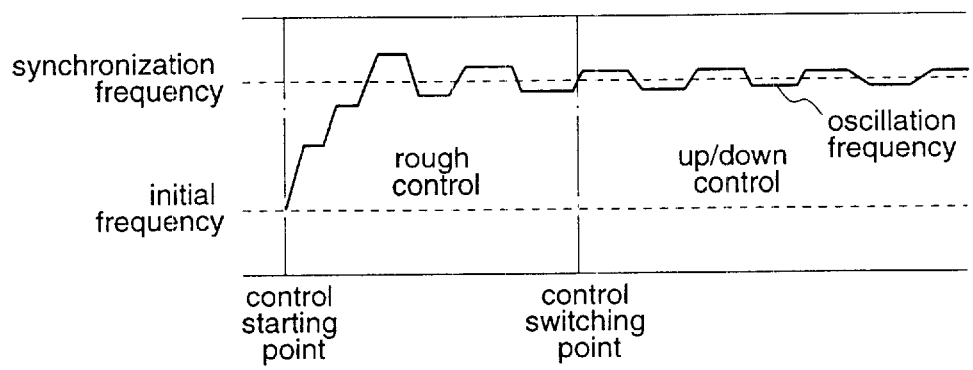

The phase synchronization maintaining means 38 may be based on the control method as shown in FIG. 14, for example. In a case where the frequency of the oscillation clock of the VCO is pulled in to a frequency domain where a phase synchronization is possible by the frequency synchronization control means 37, the phase control signal as the output signal of the loop filter 10 as shown in FIG. 14(a) provides an arbitrary phase maintaining level in both directions of phase advance and phase delay before reaching the phase control limit, and an up control signal is supplied to the VCO control means 39 when the phase control signal exceeds the phase holding level in the advance direction, while a down control signal is supplied to the VCO control means 39 when the phase control signal exceeds the phase maintaining level in the delay direction. By the up/down control of the frequency, the frequency of the oscillation clock of the VCO 40 is controlled to remain in the area where a phase synchronization is possible, thereby enabling a smooth phase synchronization control with no discontinuity point of phase existing. At this time, the control of oscillation frequency of the VCO 40 draws a frequency curve as shown in FIG. 14(b).

By performing a series of the frequency control, a frequency of an asynchronous clock when a reproduction signal is sampled can be always maintained within an area where a control of digital phase-locked loop is possible. Therefore, no discontinuity point occurs at phase synchronization control, resulting in a stable digital recorded data reproduction, and a frequency control and a phase control can be thought separately, thereby realizing a circuit of an oscillator and a control means by a simple configuration. Specifically, there are secular changes and variations in performance in an analog circuit of the VCO or the like, and thus a compensation circuit is required; however, it is possible to simplify a circuit configuration by employing the control method of the present invention, thereby reducing a cost as well as lowering power consumption.

A transversal filter 6, a phase comparator 9, a loop filter 10, and a phase-interpolation-type tap weighting factor control means 33 in FIG. 10 may be employed instead of the transversal filter 6, the high-order interpolation filter 7, a tap weighting factor control means 8, the phase comparator 9, and the loop filter 10, and the phase-interpolation-type tap weighting factor control means 33.

Figure 15A:
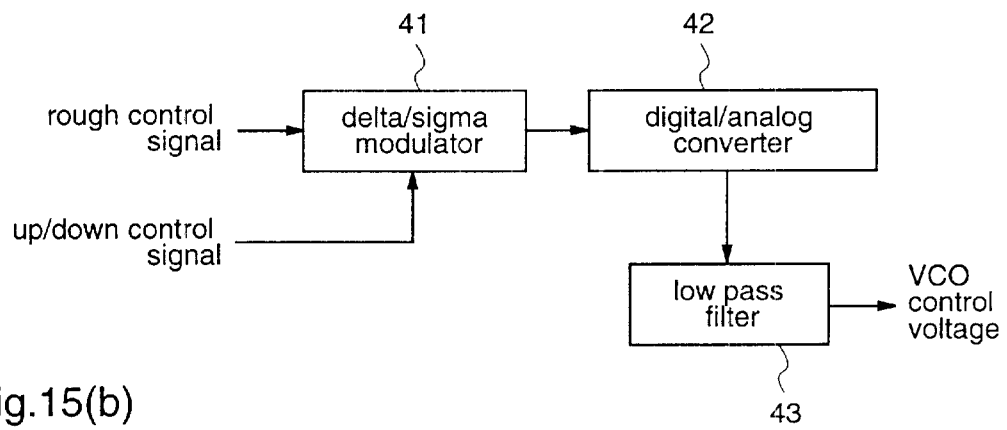
FIG. 15 is a block diagram illustrating a configuration of the VCO control means 39 as well as a schematic diagram of an operation principle thereof in the third embodiment.
Figure 15B:
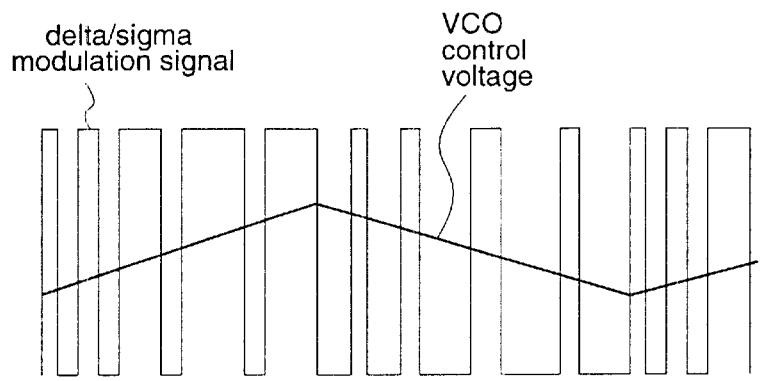

The VCO control means 39 may be one as shown in FIG. 15(a), for example. That is, it inputs a frequency rough control signal outputted from the frequency control means 37 and a frequency up/down control signal outputted from the phase synchronization maintaining means 38, respectively, to a delta/sigma modulator 41, utilizes oversampling to perform modulation in a time direction, and inputs its output to a digital/analog converter 42 thereafter, thereby to convert a digital control signal to a voltage value. The converted voltage value is inputted to a low pass filter 43 as a smoothing means and is reformed to a smooth VCO control voltage, resulting in a control finer than a minimum controlled variable of an oscillation frequency originally held by the VCO 40. The relationship between the VCO control voltage and the output of the delta/sigma modulator 41 at the time is shown in FIG. 15(b).

In a case where a minimum frequency control resolution of an oscillator is rough and an oscillation frequency varies vastly at up/down control when a frequency of an asynchronous clock employed for reproduction signal sampling is maintained within a controllable range of the digital phase-locked loop, there is a risk of disturbance generation in the phase-locked loop; however, a modulation is performed in a time direction to control an oscillation frequency of an oscillator with finer resolution than original, whereby there is no disturbance at up/down and a successive reproduction is possible, resulting in an improvement in reproduction quality.

Figure 16A:
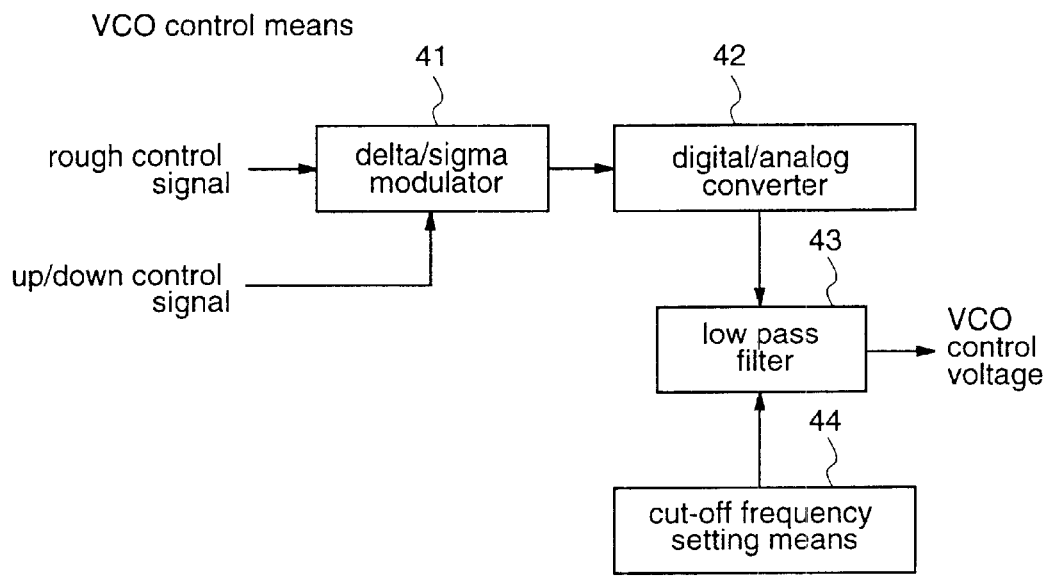
FIG. 16 is a block diagram illustrating a configuration of the VCO control means 39 as well as a schematic diagram of an operation principle for a different reproduction speed in the third embodiment.

The VCO control means 39 may be one as shown in FIG. 16 (a), for example. That is, it inputs a frequency rough control signal outputted from the frequency control means 37 and a frequency up/down control signal outputted from the phase synchronization maintaining means 38, respectively, to a delta/sigma modulator 41, utilizes oversampling to perform modulation in a time direction, and inputs its output to a digital/analog converter 42 thereafter, thereby to convert a digital control signal to a voltage value. The converted voltage value is inputted to a low pass filter 43 as a smoothing means and is reformed to a smooth VCO control voltage, resulting in a control finer than a minimum controlled variable of an oscillation frequency originally held by the VCO 40. At the time, a cut-off frequency setting means 44 as a means for switching a cut-off frequency of the low pass filter 43 is provided according to a variation amount of reproduction speed due to a double speed mode of reproduction, a difference between the inner and outer peripheries at disk reproduction, or the like.

Figure 16B:
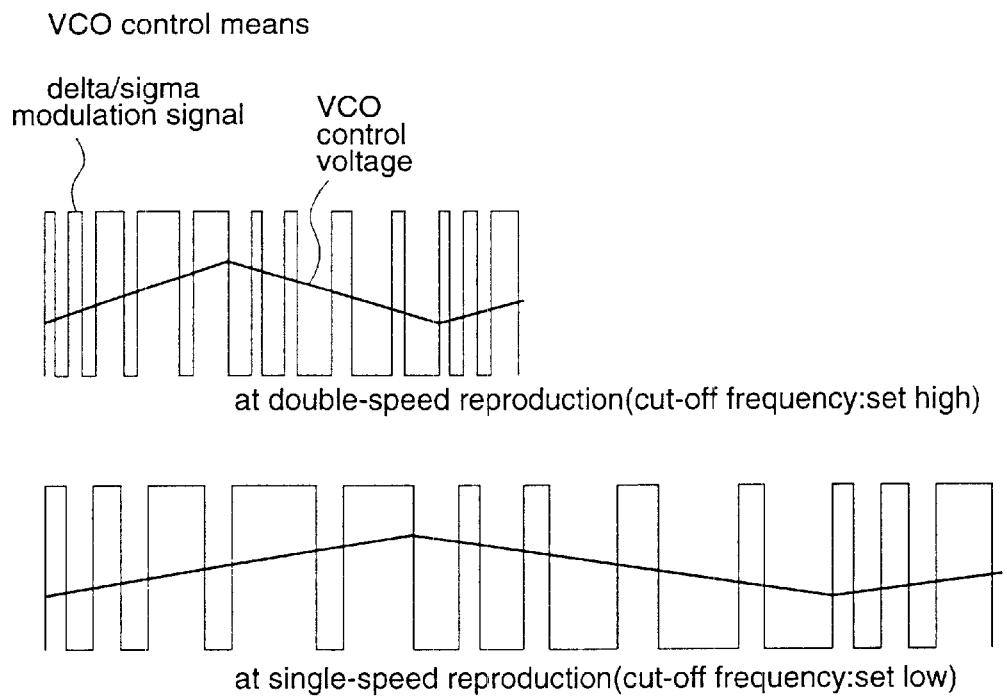

The cut-off frequency can be varied in conjunction with a reproduction clock frequency, resulting in further improvement in performance. The relationship between the VCO control voltage and the output of the delta/sigma modulator 41 at the time is as shown in FIG. 16(b). When the cut-off frequency of the low pass filter is fixed, a normal reproduction is performed at double speed, while the VCO control voltage is disturbed when reproduction is performed at single speed, that is, a reproduction channel route becomes double in length. However, the cut-off frequency is set lower at a point of time when a double speed reproduction is switched to a single speed reproduction, thereby to maintain a smooth control as shown in FIG. 16(b). can obtain a similar effect on a difference between the inner and outer peripheries of a reproduction speed, which exists in a CAV reproducing method as a method for keeping a rotation number of a spindle motor constant at disk rotation.

Therefore, in a case where plural reproduction speeds have to be compensated, or there is a difference between the inner and outer peripheries, that is, a deviation of frequency in the inner and outer peripheries in a disk medium as well as a kind of recording medium is different, so that a broad range of frequency control band is provided when digital recording data are reproduced, response characteristics suitable for each reproduction speed can be realized, thereby easily corresponding to a wide variety of reproduction double speed modes, resulting in a digital recorded data reproducing device which can maintain reproduction characteristics even under the condition that a reproduction speed changes vastly. Further, an analog element held in the digital data reproducing device can be decreased, thereby enabling a stable data reproduction even when a circuit configuration is simplified, resulting in further cost reduction.

Embodiment 4

Hereinafter, a fourth embodiment which corresponds to a digital recorded data reproducing device as defined in claims 6 to 9 and 21 to 32 will be described with reference to FIGS. 17 to 22.

Figure 17:
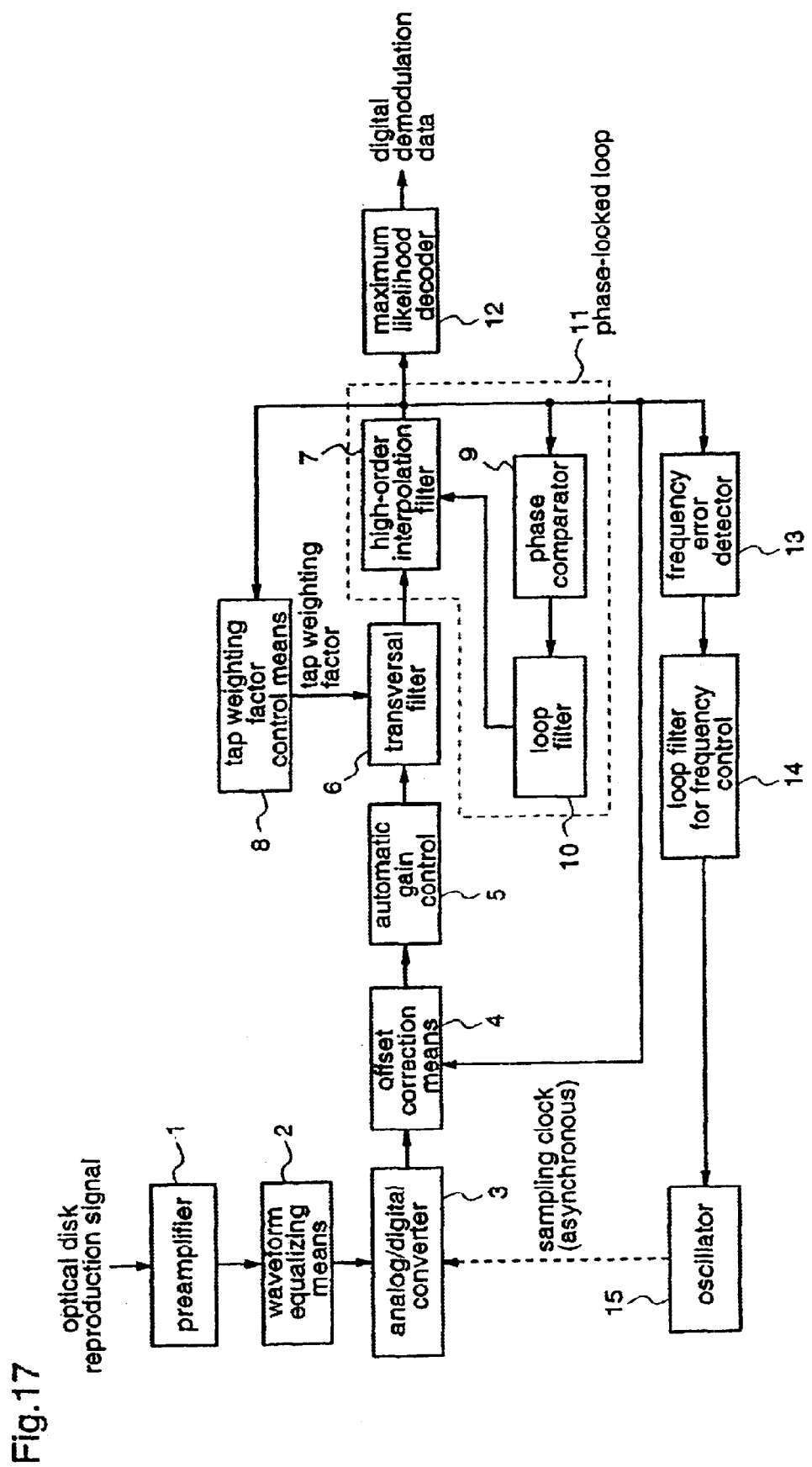
FIG. 17 is a block diagram illustrating a configuration be of a digital recorded data reproducing device according to a fourth embodiment of the present invention.

In FIG. 17, an optical disk reproduction signal obtained by a reproducing means (such as an optical pickup) not shown has its output amplitude emphasized by a preamplifier 1, and is subjected to correction which emphasizes a high frequency by a waveform equalizing means 2 thereafter. The waveform equalizing means 2 comprises a filter such as a high-order equalizing ripple filter, which enables an arbitrary setting of a boost amount and a cut-off frequency, for example. An output signal of the waveform equalizing means 2 is sampled to a digital signal with multiple bits by an analog/digital converter 3 as a means for converting an analog signal to a digital signal. At the time, there is employed a clock which is generated by an oscillator 15 and has a clock component asynchronous with that of the reproduction signal. The sampled digital signal with multiple bits and an output signal of a high-order interpolation filter 7 are inputted to an offset correction means 4 to correct an offset component included in the reproduction digital signal.

Figure 18:
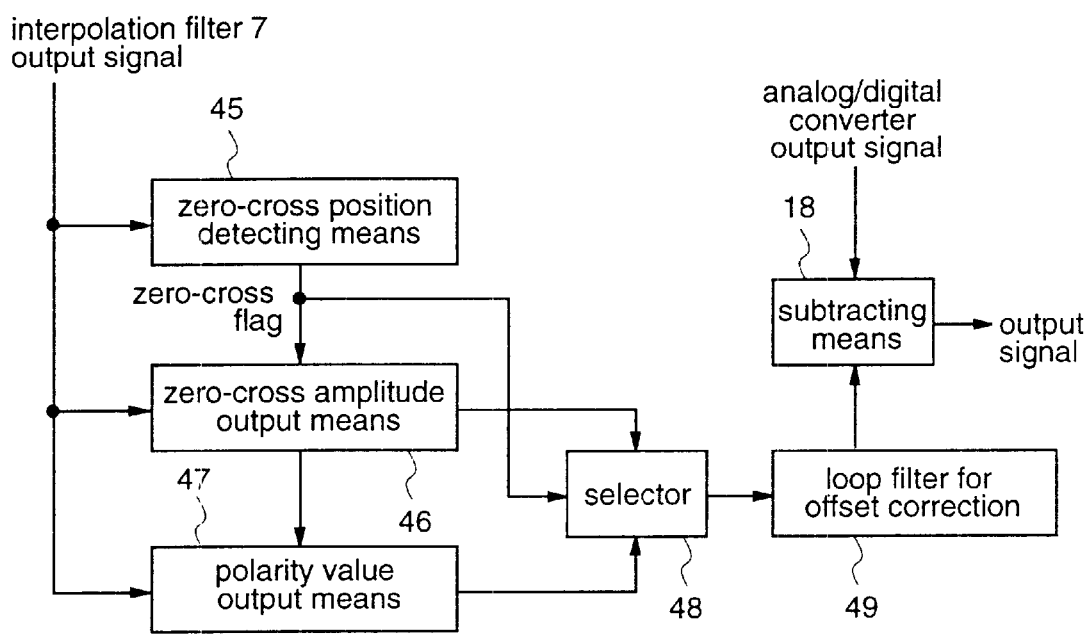
FIG. 18 is a block diagram illustrating the configuration of an offset correction means 4 in the fourth embodiment.

The offset correction means 4 may be constituted as shown in FIG. 18, for example. That is, it performs an integration as an offset error signal by a zero-cross position detecting means 45 which is constituted by a function of detecting a position where a signal crosses zero level from the output signal of the high-order interpolation filter 7 and outputting a zero-cross flag, a zero-cross amplitude output means 46 which is constituted by a function of outputting an amplitude difference (E in the figure) between the true DC level and the pseudo DC level shown in FIG. 19 with respect to a sampling signal at a zero-cross position as indicated by "●" in FIG. 19, a polarity value output means 47 which is constituted by a function of outputting an arbitrary value X or −X according to the signal polarity with respect to a sampling signal at a position other than a zero-cross position, and a selector 48 as a means for switching output signals of the zero-cross amplitude output means 46 and the polarity value output means 47 by a zero-cross flag to output, so as to input to a loop filter 49 for offset correction for smoothing thereafter. Finally, an output signal of the loop filter 49 for offset correction is directly subtracted from an output signal of the analog/digital converter 3 by a subtracting means 18, thereby to perform an offset correction.

Figure 19:
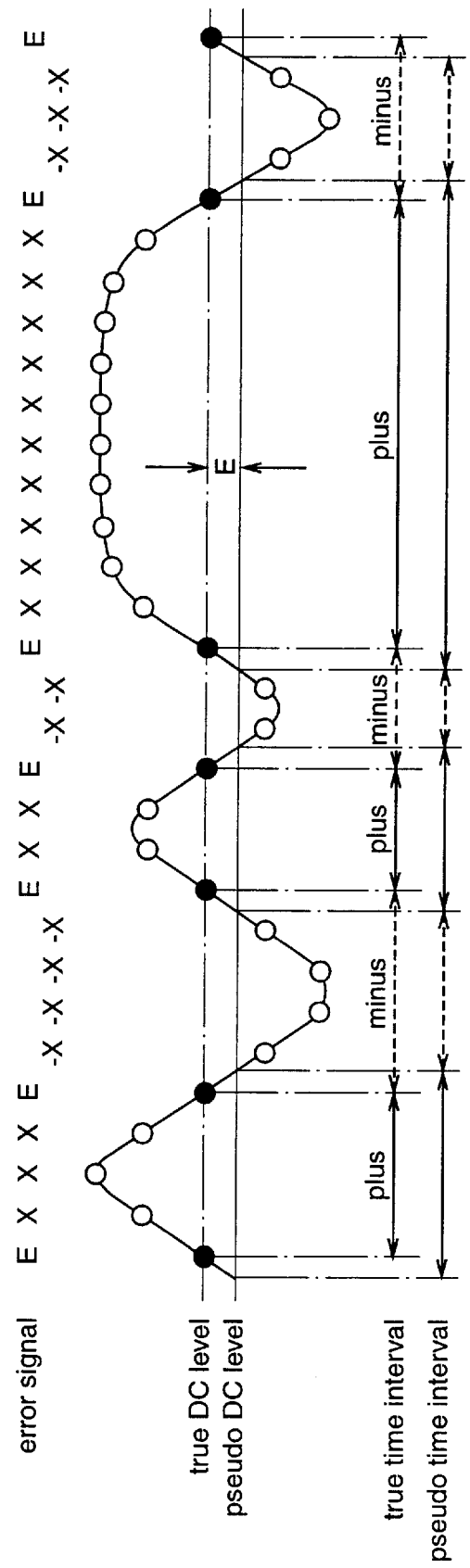
FIG. 19 is a schematic diagram of an operation principle of the offset correction means 4 in the fourth embodiment.

A conventional method of performing a control regarding only a code of a signal follows a DC level fluctuation of high frequency component, thereby deteriorating a reproduction signal quality due to control noise occurring from an uncertainty of detected offset information when a loop gain is increased. However, the offset correction means 4 as shown in FIG. 18 being employed, the value X shown in FIG. 19 is selected appropriately, so that an offset error amount can be developed in a time direction, thereby detecting an offset error amount with higher accuracy, which could not be obtained only by a signal polarity. Therefore, there is a less increase in control noise than conventional even when a loop gain is increased, thereby suppressing a deterioration in reproduction signal quality which accompanies an offset correction as well as ensuring a high followup property and a stable operation for an abnormal signal generated by a DC level fluctuation having a higher frequency component, an amplitude modulation, a scratch, or the like. An output signal of the offset correction means 4 is inputted to the automatic gain control 5, so that an amplitude of the reproduction digital signal is adjusted to be an arbitrary value. The automatic gain control 5 may detect an envelope of a signal waveform and perform a control so that a difference between an arbitrary set value and an envelope signal is zero, for example.

Next, an output signal of the automatic gain control 5 is inputted to a transversal filter 6 and is subjected to a partial response equalization. Here, the partial response equalization employs a PR system (3, 4, 4, 3) which divides a waveform amplitude after equalization into five values (0, 4×A, 7×A, −4×A, −7×A) as shown in FIG. 3(c) in a DVD-ROM (Read Only Memory) which is capable of digital recording of 4.7G byte for a layer on a single side, for example. There exist diverse types of partial response other than the PR (3, 4, 4, 3) system, and it is not restricted to a specified system and it makes no difference to employ other systems if only what is equivalent to performance is possible. The partial response system which adds a correlativity in a time direction of reproduction data and a viterbi decoder as one of after-mentioned maximum likelihood decoding methods (Maximum Likelihood), which demodulates the most probable series employing the added data correlativity, are combined, thereby to realize a PRML signal processing which is considered to be advantageous for a high recording density reduction in a linear recording direction. Since the PRML signal processing system has various combinations according to characteristics of reproduced waveform or modulation codes as described above, an appropriate system is required to be selected for various recording reproduction systems. The transversal filter 6 is a FIR (Finite Impulse response Filter) filter constituted by finite taps, for example. Equalization characteristics by the FIR filter can be realized by varying a weighting factor of a tap. A signal subjected to a partial response equalization by the transversal filter 6 is converted to a signal in a regular sampling phase by a high-order interpolation filter 7. The high-order interpolation filter 7 may be based on Nyquist interpolation characteristics as shown in FIG. 5, for example. In the Nyquist characteristics as shown in FIG. 5, each amplitude value when a channel rate (1T) is divided into N parts in a time direction is stored in a register, and, while the register which performs a selection to set a factor of a phase indicated by phase control information is switched in accordance with the phase control information, a phase interpolation is performed. Thereby, a reproduction signal sampled asynchronously is converted to a reproduction equalization signal equal to a regular sampling phase.

The high-order interpolation filter 7 may be a FIR filter which comprises delay elements 19a–19f, multiplication elements 20a–20g, and an adding means 21.

At this time, when a phase interpolation is performed, while filter factors held in registers 22a to 22g as shown in FIG. 6 are switched by selectors 23a to 23g based on phase control information as an output signal of a loop filter 10, tap factors S1 to S7 are set. Here, the factors of the registers 22a to 22g have Nyquist characteristic value for each phase in FIG. 5 divided into N parts, such as eight parts from a to h as shown in FIG. 5, for example, and areas from 1 to 7 are stored correspondingly to respective taps of the FIR filters shown in FIG. 6. For example, when phase control information at the present moment obtained from the loop filter 10 is a sampling phase different from a regular phase by 180°, filter factors at phases of "●", that is, e in areas from 1 to 7 shown in FIG. 5 are set as tap factors of S1 to S7. The larger the division number N in a time direction is, the higher the accuracy of a phase control becomes, while an increase in the division number N leads to an increase in a circuit scale, and thus the division number is set on condition which allows performance and a circuit scale to be compatible. An output signal of the high-order interpolation filter 7 is inputted to a tap weighting factor control means 8 to control a tap weighting factor of the transversal filter 6 adaptively, so as to minimize an equalization error.

The tap weighting factor control means 8 may employ Least Mean Square algorithm as shown in FIG. 7, for example. That is, it comprises an equalization error detector 25 which detects an equalization target value corresponding to the partial response system from the output signal of the high-order interpolation filter 7 by a temporary judging circuit 24, and detects an equalization error by subtracting the equalization target value and the output signal of the high-order interpolation filter 7, a correlator 26 which calculates a correlation between an output signal of the equalization error detector 25 and the output signal of the high-order interpolation filter 7, a feedback gain regulator 27 as a means for multiplying an output of the correlator 26 by the same number as a gain to regulate a feedback gain, and a tap factor updating part 28 as a means for adding the output of the regulator to a weighting factor of each tap to update a tap factor.

Next, a digital phase-locked loop 11 comprises a phase comparator 9 for detecting a phase error from the output signal of the high-order interpolation filter 7, a loop filter 10 for smoothing a phase error signal outputted from the phase comparator 9, and a feedback loop which controls a filter factor of the high-order interpolation filter 7 with the output signal of the loop filter as phase control information.

A data demodulation is performed through a maximum likelihood decoder 12 which performs decoding according to a type of partial response employing a partial response equalization waveform in a regular phase outputted through a series of the operation. Here, the maximum likelihood decoder 12 may be a viterbi decoder, for example. The viterbi decoder performs a probability calculation according to a law of correlation of an intentionally added code in accordance with a type of partial response so as to reproduce the most probable series.

A means for controlling a sampling clock of the analog/digital converter 3 is realized by a frequency control loop which comprises a frequency error detector 13 as a means for detecting a pattern length of a synchronization pattern or an interval at which the synchronization pattern is generated from the output signal of the high-order interpolation filter 7 to convert to frequency cycle, thereby outputting a frequency error signal, a loop filter 14 for frequency control as a means for smoothing the frequency error signal outputted from the frequency error detector 13, and an oscillator 15 which supplies a clock to the analog/digital converter 3.

The frequency error detector 13 may be constituted as shown in FIG. 9, for example. That is, there is employed an output of a zero-cross length detector 29 which comprises a means for successively detecting a position where a signal crosses zero level from the output signal of the high-order interpolation filter 7 and counting the sampling number between neighboring zero-crosses to hold in a register, and cycle information 1 which is inversely proportional to a linear velocity cycle of reproduction data is obtained by a synchronization pattern length detector 31 which comprises a means for detecting a maximum value obtained by adding a count value to hold in a register, only when a ratio of neighboring zero-cross lengths within a period set by a frame counter 30 which comprises a means for counting a specified period over one frame satisfies a ratio of synchronization pattern, such as 14:4 in a DVD-ROM After being pulled in to some extent by a synchronization pattern length, in order to make a frequency closer to a frequency of a clock component held by the reproduction clock, a cycle where synchronization pattern is generated is detected by a synchronization pattern interval detector 32 which comprises a means for outputting a synchronization pattern flag at a position judged to be a synchronization pattern by the synchronization pattern length detector 31 and counting an interval until a synchronization pattern flag is detected next, and a difference from 1448T (T represents 1 channel bit here) in a DVD-ROM, for example, is obtained as cycle information 2. An oscillation clock of the oscillator 15 is controlled to a frequency domain where a phase synchronization is possible by the cycle information 1 and the cycle information 2.

In this way, by employing the method of developing the offset error signal in a time direction, it is possible to detect an offset error amount with higher accuracy, which could not be obtained only by a signal polarity.

Therefore, there is a less increase in control noise than conventional even when a loop gain is increased, thereby a suppressing a deterioration in reproduction signal quality which accompanies an offset correction as well as ensuring a high followup property and a stable operation for an abnormal signal generated by a DC level fluctuation having a higher frequency component, an amplitude modulation, a scratch, or the like. Thereby, it is possible to enhance playability even at reproduction under an abnormal condition.

That is, in a digital data reproduction of an optical disk system in which asymmetry exists in a signal waveform as well as which has the possibility that a rapid amplitude modulation, an offset level fluctuation, or the like which is caused by a scratch, a defect, or the like should occur, a ratio of an offset correction by a code polarity component which employs characteristics of a recording modulation code to an offset correction by an amplitude component in a sampling phase of zero-cross neighborhood is altered adaptively, so that the most suitable offset correction is possible according to a control state, thereby enhancing a followup property and restoration performance for an abnormal signal caused by a scratch, a defect, or the like. Further, it is an advantageous state also for a control of frequency pull-in or phase-locked pull-in, thereby enabling a high speed phase-locked pull-in after seek.

A transversal filter 6, a phase comparator 9, a loop filter 10, and a phase-interpolation-type tap weighting factor control means 33 may be employed instead of the transversal filter 6, the high-order interpolation filter 7, a tap weighting factor control means 8, the phase comparator 9, and the loop filter 10.

Figure 20:
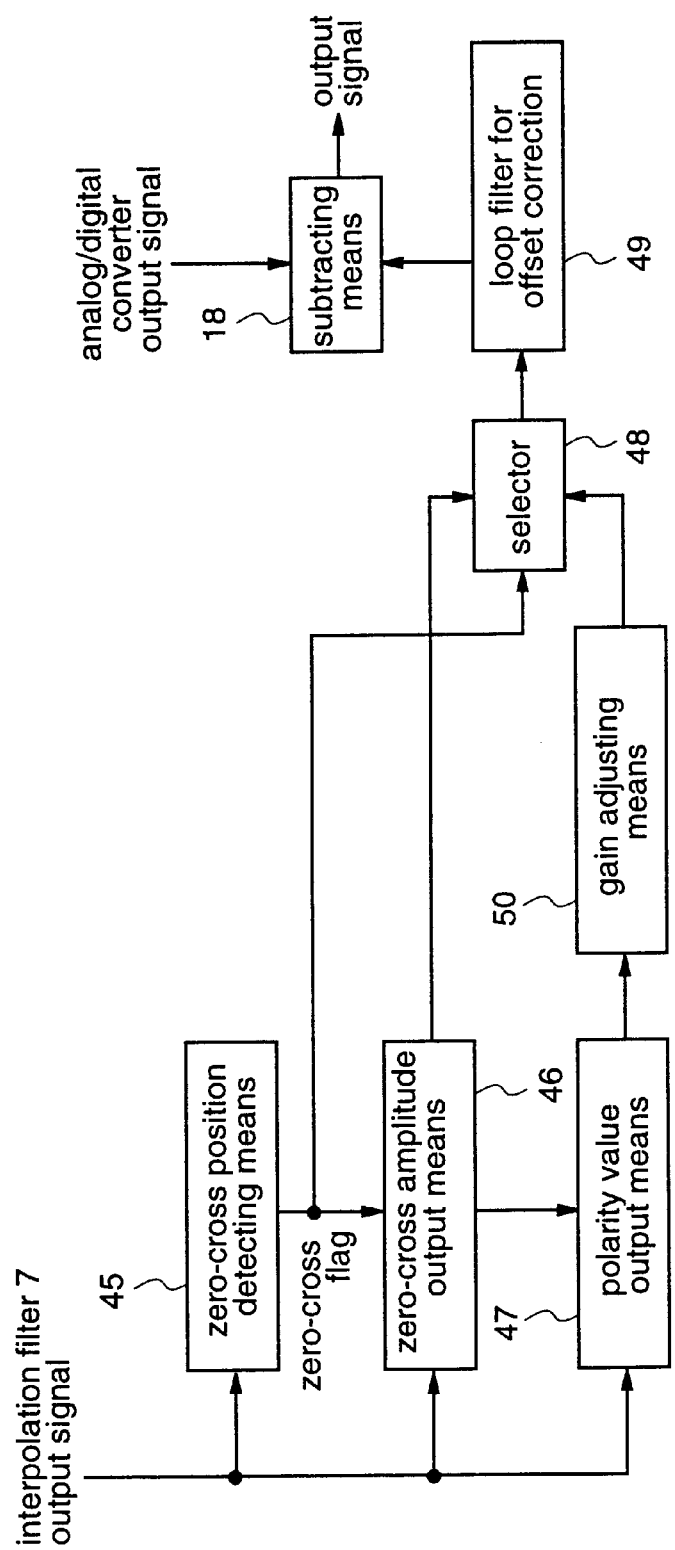
FIG. 20 is a block diagram illustrating a configuration of an offset correction means 4 in the fourth embodiment.

The offset correction means 4 may be constituted as shown in FIG. 20. That is, it comprises a zero-cross position detecting means 45 which is constituted by a function of detecting a position where a signal crosses zero level from the output signal of the high-order interpolation filter 7 and outputting a zero-cross flag, a zero-cross amplitude output means 46 which is constituted by a function of outputting an amplitude difference (E in the figure) between the true DC level and the pseudo DC level shown in FIG. 19 with respect to a sampling signal at a zero-cross position as indicated by "●" in FIG. 19, and a polarity value output means 47 which is constituted by a function of outputting an arbitrary value X or −X according to a signal polarity with respect to a sampling signal at a position other than a zero-cross position, and is capable of setting an arbitrary gain for an output signal of the polarity value output means 47 by a gain adjusting means 50.

That is, X shown in FIG. 19 can be set to an arbitrary value, whereby it is possible to adjust whether an offset correction control is performed chiefly for an output signal of the zero-cross amplitude output means 46 or of the polarity value output means 47. In a case where it is done mainly for the output signal of the zero-cross amplitude output means 46, a control which is advantageous for a DC level fluctuation after phase-locked pull-in can be performed, though, when a phase-locked pull-in falls down, an offset correction control also falls down at the same time. On the contrary, in a case where it is done mainly for the output signal of the polarity value output means 47, the offset correction control can be performed reliably at high speed, though control noise is increased.

The output signals of the zero-cross amplitude output means 46 and the gain adjusting means 50 obtained as described above are integrated as an offset error signal by the selector 48 as a means for switching the output signals by a zero-cross flag to output, and this is inputted to the loop filter 49 for offset correction for smoothing thereafter. Finally, an output signal of the loop filter 49 for offset correction is directly subtracted from an output signal of the analog/digital converter 3 by a subtracting means 18, thereby to perform an offset correction.

In this way, according to which of the output signals of the zero-cross amplitude output means and the polarity value output means is made main, a control can have diverse variations in response speed or control noise, thereby enabling an offset correction suitable for the condition such as the reproduction of different recording media or a waveform.

Figure 21:
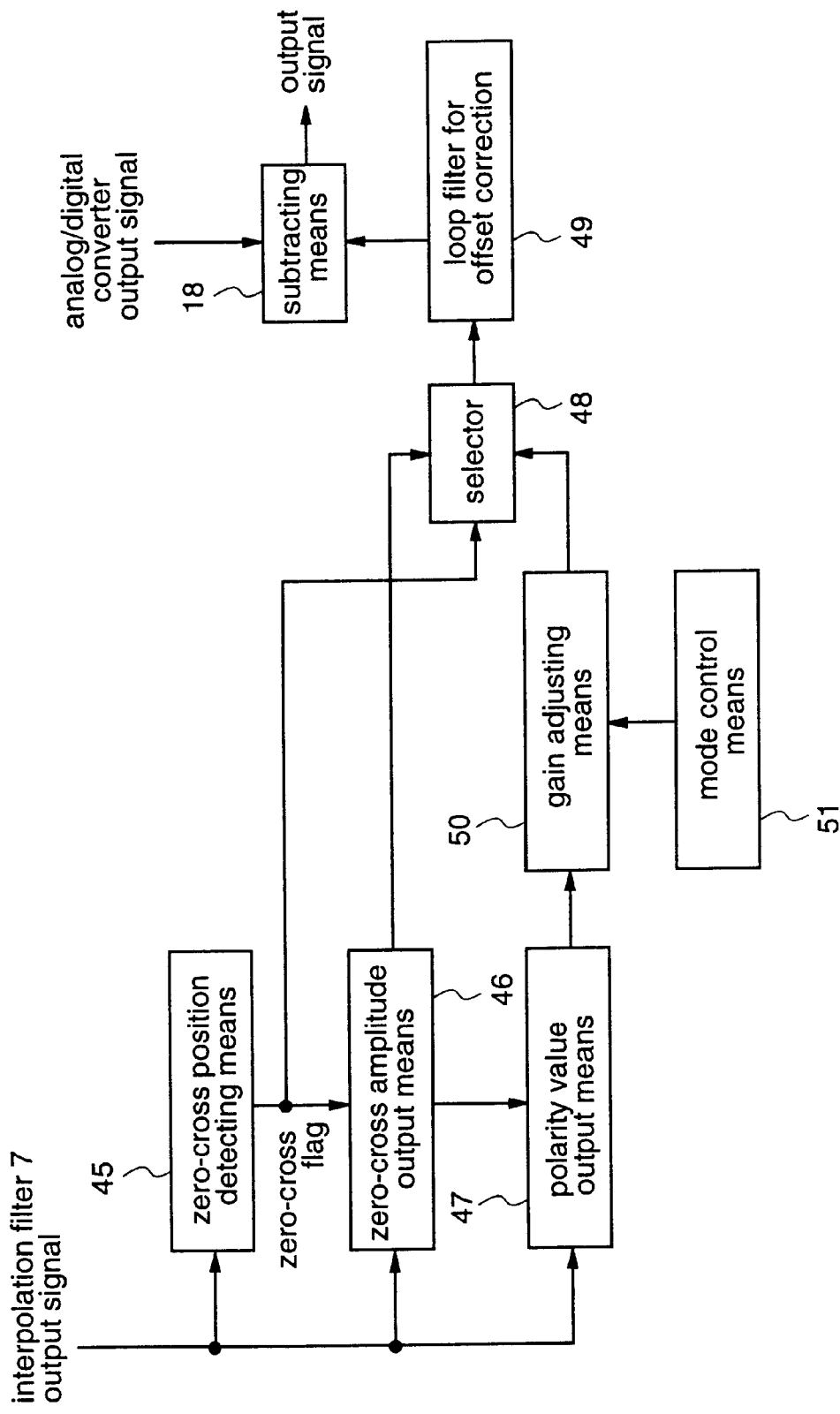
FIG. 21 is a block diagram illustrating a configuration of an offset correction means 4 in the fourth embodiment.

The offset correction means 4 may be constituted as shown in FIG. 21. It comprises a zero-cross position detecting means 45 which is constituted by a function of detecting a position where a signal crosses zero level from the output signal of the high-order interpolation filter 7 and outputting a zero-cross flag, a zero-cross amplitude output means 46 which is constituted by a function of outputting an amplitude difference (E in the figure) between the true DC level and the pseudo DC level shown in FIG. 19 with respect to a sampling signal at a zero-cross position as indicated by "●" in FIG. 19, and a polarity value output means 47 which is constituted by a function of outputting an arbitrary value X or −X according to a signal polarity with respect to a sampling signal at a position other than a zero-cross position, and is capable of setting an arbitrary gain for an output signal of the polarity value output means 47 by a gain adjusting means 50. Further, there is provided a mode control means 51 as a means for controlling the gain adjusting means 50. By the mode control means 51, it is possible to set a mode of performing a control mainly for the output signal of the polarity value outputting value 47 to enhance response performance at seek, for example, and to switch the mode to a mode of performing a control mainly for the output signal of the zero-cross amplitude output means 46 when a phase-locked pull-in is performed. The output signals of the zero-cross amplitude output means 46 and the gain adjusting means 50 obtained as described above are integrated as an offset error signal by the selector 48 as a means for switching the output signals by a zero-cross flag to output, and this is inputted to the loop filter 49 for offset correction for smoothing thereafter. Finally, an output signal of the loop filter 49 for offset correction is directly subtracted from an output signal of the analog/digital converter 3 by a subtracting means 18, thereby to perform an offset correction.

In this way, characteristics of the offset correction control is switched according to the control mode, thereby enabling the most suitable offset correction according to state, such that a control is performed mainly for a code polarity at seek where a followup property to a level fluctuation is required more than the accuracy of a reproduction signal, while a control is performed mainly for a zero-cross amplitude at reproduction of successive data where the accuracy of a reproduction signal is required. Further, it involves convergency of control, thereby enabling a high speed phase-locked pull-in after seek.

Figure 22:
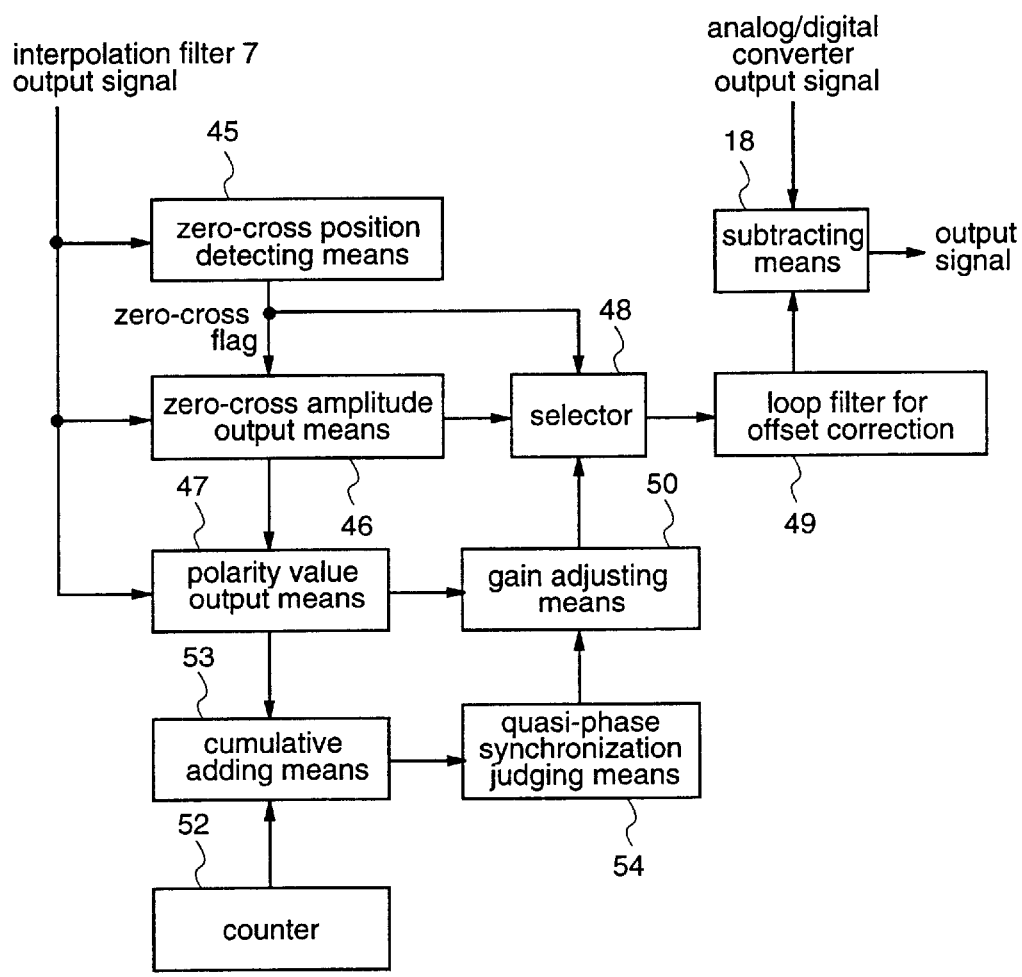
FIG. 22 is a block diagram illustrating a configuration of an offset correction means 4 in the fourth embodiment.
Figure 23:
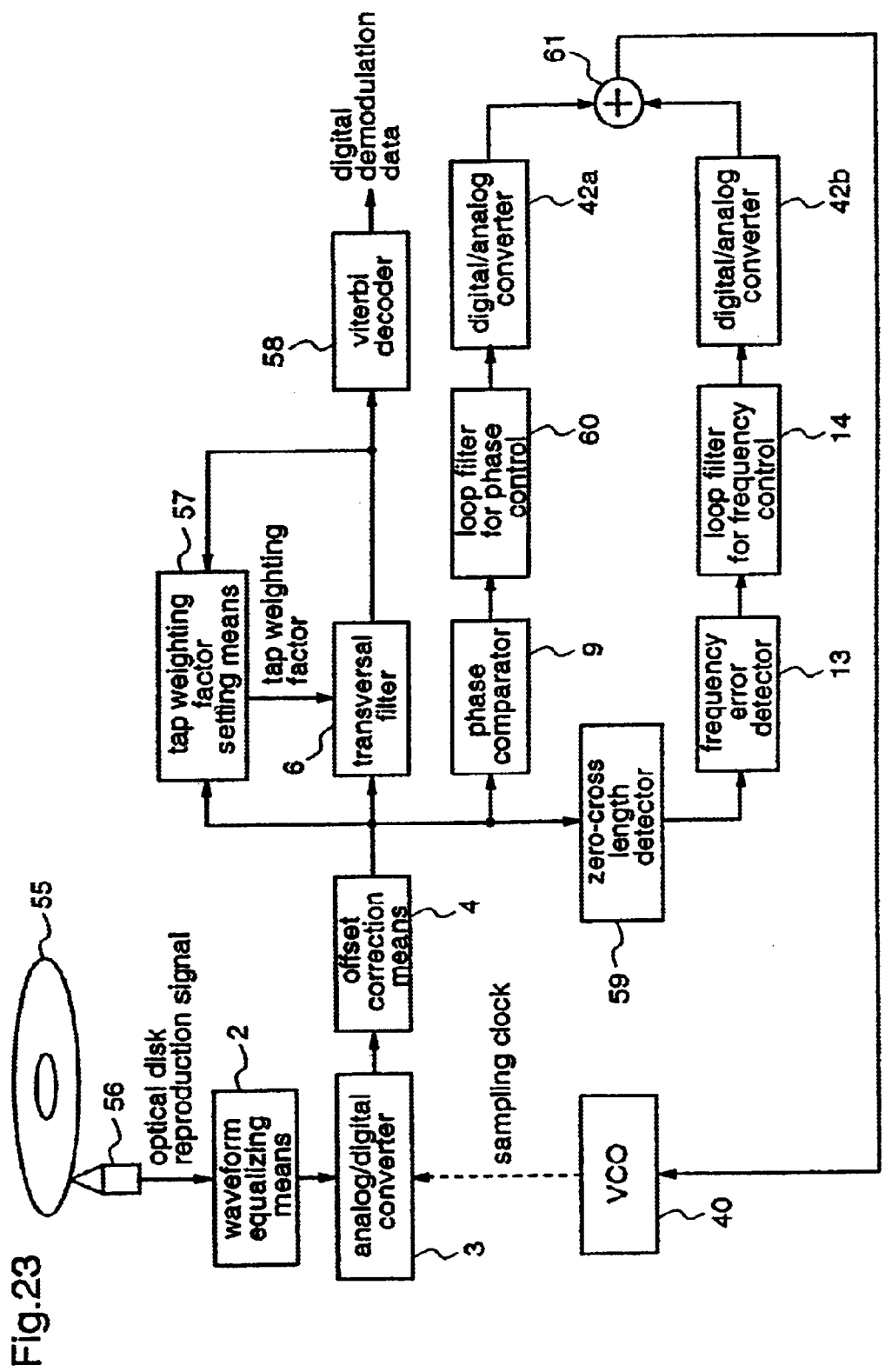
FIG. 23 is a block diagram illustrating a configuration of a conventional optical disk reproducing device.

The offset correction means 4 may be constituted as shown in FIG. 22.

It comprises a zero-cross position detecting means 45 which is constituted by a function of detecting a position where a signal crosses zero level from the output signal of the high-order interpolation filter 7 and outputting a zero-cross flag, a zero-cross amplitude output means 46 which is constituted by a function of outputting an amplitude difference (E in the figure) between the true DC level and the pseudo DC level shown in FIG. 19 with respect to a sampling signal at a zero-cross position as indicated by "●" in FIG. 19, and a polarity value output means 47 which is constituted by a function of outputting an arbitrary value X or −X according to a signal polarity with respect to a sampling signal at a position other than a zero-cross position, and is capable of setting an arbitrary gain for an output signal of the polarity value output means 47 by a gain adjusting means 50. When a control is stabilized in a quasi-phase synchronization state, as a means for restoring the state to a normal phase synchronization state, a cumulative adding means 53 adds the output signal of the polarity value output means 47, and a quasi-phase synchronization judging means 54 monitors its output signal level to judge whether it is a quasi-phase synchronization state or not in an arbitrary certain period of time set by a counter 52. When judged as a quasi-phase state, an offset correction by a code polarity component is strengthened employing the gain adjusting means 50, thereby to restore the state to a normal phase synchronization state. The output signals of the zero-cross amplitude output means 46 and the gain adjusting means 50 obtained as described above are integrated as an offset error signal by the selector 48 as a as means for switching the output signals by a zero-cross flag to output, and this is inputted to the loop filter 49 for offset correction for smoothing thereafter. Finally, an output signal of the loop filter 49 for offset correction is directly subtracted from an output signal of the analog/digital converter 3 by a subtracting means 18, thereby to perform an offset correction.

With such configuration, even when a quasi-phase synchronization is generated due to a rapid offset level fluctuation or amplitude modulation which occurs by a scratch, a defect, or the like, a self-restoring can be performed early so as to be returned to an original phase synchronization state, thereby obtaining a digital recorded data reproducing device which enhances playability.

Applicability in Industry

As described above, a digital recorded data reproducing device according to the present invention is suited to be employed for a part where a phase equalization of reproduced digital recording data is performed in a reproduction system of a digital recorded data reproducing device which reproduces digital recording data recorded on an optical disk.

What is claimed is:

1. A digital recorded data reproducing device comprising:
    an analog/digital converting means for sampling a reproduction signal of a recording medium to digital data asynchronously with a phase of a clock component included in the signal;
    a digital data correction means for correcting an offset component and an amplitude from the sampled signal;
    an equalizing filter for subjecting the corrected signal to a partial response equalization;
    an interpolation filter for reproducing a signal in a regular sampling phase from the signal subjected to the partial response equalization by interpolation;
    a filter factor control means for adaptively controlling a filter factor of the equalizing filter so that an equalization error is minimum based on an output signal of the interpolation filter;
    a phase-locked loop for detecting a phase error based on the output signal of the interpolation filter to update a filter factor of the interpolation filter; and
    a maximum likelihood decoder for subjecting the output signal of the interpolation filter to a maximum likelihood decoding according to a type of partial response at equalization by the equalizing filter so as to perform a data demodulation.

2. A digital recorded data reproducing device comprising:
    an analog/digital converting means for sampling a reproduction signal of a recording medium to digital data asynchronously with a phase of a clock component included in the signal;
    a digital data correction means for correcting an offset component and an amplitude from the sampled signal;
    an equalizing filter for subjecting the corrected signal to a partial response equalization;
    a phase-locked loop for detecting a phase error based on an output signal of the equalizing filter;
    a filter factor control means for adaptively controlling a filter factor of the equalizing filter so that an equalization error is minimum based on the output signal of the equalizing filter as well as controlling the filter factor so that there is no phase error based on an output of the phase-locked loop; and
    a maximum likelihood decoder for performing a maximum likelihood decoding according to a type of partial response at equalization by the equalizing filter so as to perform a data demodulation.

3. The digital recorded data reproducing device as defined in claim 1 or 2 comprising:
    a clock generating means for generating a clock with a phase asynchronous with that of a clock signal included in the reproduction signal of the recording medium;
    a frequency control means for controlling a frequency of the clock generated by the clock generating means based on the output of the phase-locked loop; and
    a phase synchronization maintaining means for performing a control so that a phase of the clock generated by the clock generating means maintains a synchronization state based on the output of the phase-locked loop.

4. The digital recorded data reproducing device as defined in claim 3 comprising:
    a delta/sigma modulating means for subjecting control signals from the frequency control means and the phase synchronization maintaining means to a delta/sigma modulation; and
    a low pass filter for removing a high frequency component of an output signal of the delta/sigma modulating means.

5. The digital recorded data reproducing device as defined in claim 4 comprising:
    a time constant varying means for varying a time constant of the low pass filter.

6. The digital recorded data reproducing device as defined in claim 1 or 2, wherein
    when an offset adjustment is performed, the digital data correction means adds an amplitude component of a point where a center line of a sampled waveform crosses zero level with respect to the point, while the means adds a prescribed value according to a polarity of a reproduction code with respect to the other points where a code is decided.

7. The digital recorded data reproducing device as defined in claim 1 or 2, wherein
    when an offset adjustment is performed, the digital data correction means adds an amplitude component of a point where a center line of a sampled waveform crosses zero level with respect to the point, while the means adds a value according to a polarity of a reproduction code with respect to the other points where a code is decided, and makes the additional value different between at seek operation and at the other time.

8. The digital recorded data reproducing device as defined in claim 7, wherein
    the digital data correction means increases the additional value at seek operation while the means decreases the additional value in a phase synchronization state.

9. The digital recorded data reproducing device as defined in claim 1 or 2, wherein
    when an offset adjustment is performed, the digital data correction means monitors a cumulative additional value for a prescribed period of time at each point in a sampled waveform and gives feedback of an error amount for a direct current part discretely to the direct current part.

10. The digital recorded data reproducing device as defined in claim 2, wherein
    after performing a phase-locked pull-in, the filter factor control means performs a partial response equalization successively as well as sets its loop gain to be sufficiently low as compared with the phase-locked loop, and performs switching to an intermittent control operation when the phase error is decreased.

11. A digital recorded data reproducing device comprising:
   a preamplifier for emphasizing an output amplitude of a reproduction signal from a recording medium;
   a waveform equalizing means for emphasizing a prescribed frequency band of the emphasized signal;
   an analog/digital converting means for sampling the equalized signal to a digital data with multiple bits asynchronously with a phase of a clock component included in the signal by a clock generated by an oscillator;
   an offset correction means for decreasing an offset component from the sampled signal;
   an automatic gain control means for adjusting the amplitude of the output signal to a required level;
   a transversal filter for subjecting the signal subjected to the amplitude adjustment to a partial response equalization;
   a high-order interpolation filter for reproducing a signal in a regular sampling phase from the signal subjected to the partial response equalization by a high-order interpolation;
   a tap weighting factor control means for controlling a tap weighting factor of the transversal filter from the interpolation output signal adaptively so that an equalization error is minimum;
   a phase comparator for detecting a phase error from the interpolation output signal;
   a loop filter for smoothing the phase error signal; and
   a maximum likelihood decoder for subjecting the interpolation output signal to a maximum likelihood decoding according to a type of partial response at equalization by the transversal filter so as to perform a data demodulation, wherein
   the asynchronously sampled signal is subjected to the partial response equalization, and a phase synchronization is compensated by a phase-interpolation-type digital phase-locked loop so that a data demodulation is performed.

12. A digital recorded data reproducing device comprising:
   a preamplifier for emphasizing an output amplitude of reproduction signal from a recording medium;
   a waveform equalizing means for emphasizing a prescribed frequency band of the emphasized signal;
   an analog/digital converting means for sampling the equalized signal to a digital data with multiple bits asynchronously with a phase of a clock component included in the signal by a clock generated by an oscillator;
   an offset correction means for decreasing an offset component from the sampled signal;
   an automatic gain control means for adjusting the amplitude of the output signal to a required level;
   a phase-interpolation-type transversal filter, which has functions of a transversal filter and a high-order interpolation filter together, for subjecting the signal subjected to the amplitude adjustment to a partial response equalization and reproducing a signal in a regular sampling phase from the signal subjected to the partial response equalization by a high-order interpolation;
   a phase comparator for detecting a phase error from the output signal;
   a loop filter for smoothing the phase error signal to obtain phase information;
   a tap weighting factor setting means for setting a weighting factor of a tap of the phase-interpolation-type transversal filter which makes an equalization error minimum and is for reproducing a normal sampling signal from the phase information and the output signal of the phase-interpolation-type transversal filter; and
   a maximum likelihood decoder for subjecting the interpolation output signal to a maximum likelihood decoding according to a type of partial response at equalization by the phase-interpolation-type transversal filter so as to perform a data demodulation, wherein
   the partial response equalization and a digital phase-locked loop are realized by the same filter.

13. The digital recorded data reproducing device as defined in claim 12, wherein
   the tap weighting factor setting means has a filter factor for each phase which is divided in a phase direction,
   updates the filter factor for phase control according to the phase information outputted from the loop filter,
   updates a filter factor for partial response equalization so as to minimize the equalization error based on the output signal of the phase-interpolation-type transversal filter, and
   superimposes the filter factor for phase control and the filter factor for partial response equalization, thereby setting the weighting factor of a tap of the phase-interpolation-type transversal filter.

14. The digital recorded data reproducing device as defined in claim 12, wherein
   the tap weighting factor setting means comprises:
      a temporary judging circuit for detecting an equalization target value which corresponds to partial response system based on the output signal of the transversal filter;
      an equalization error detector for detecting the equalization error based on the equalization target value and the output signal of the high-order interpolation filter;
      a correlator for detecting correlation between the equalization error and the output signal of the high-order interpolation filter;
      a feedback gain regulator for multiplying an output of the correlator by the same number as a gain to regulate a feedback gain;
      a tap factor updating part for adding an output of the feedback gain regulator to a weighting factor of each tap to update a tap factor;
      a first register for storing each amplitude value when a channel rate of Nyquist characteristics is divided in a time direction correspondingly to each tap;
      a tap factor folding means for superimposing each tap stored in the first register as well as a Nyquist interpolation factor in each phase and a tap weighting factor for partial response equalization which factor is outputted from the tap factor updating part;
      plural delay elements having delay amount of unit delay time, to which of the first stage the signal subjected to the partial response equalization is inputted and which are interconnected in series;
      an multiplier which is set correspondingly to an input of the delay element in the first stage among the plural unit delay elements as well as outputs of a connection point between delay elements and of a delay element in the last stage;

an adder for obtaining the sum total of outputs of the multiplier to generate an output of the tap weighting factor setting means;

a second register which is set correspondingly to the multiplier;

a register value updating means for updating a value of the second register based on an output of the tap factor folding means; and a selector which is set according to the second register and selects an amplitude value stored in the second register to output to the corresponding multiplier, according to the output phase information of the loop filter.

15. The digital recorded data reproducing device as defined in claim 12 further comprising:

a frequency error detector for detecting a frequency error from the output of the traversal filter; and a loop filter for frequency control for smoothing the detected frequency error and giving the same to the oscillator as a control signal, wherein a gain of a loop for frequency control which includes the loop filter for frequency control is reduced in a state where the frequency error is under a prescribed value, so that the processing shifts from a frequency pull-in control to a phase-locked pull-in control, a loop gain of a loop for phase control which includes the phase comparator is reduced in a case where the prescribed number of synchronization pattern is detected, so that the processing shifts to a partial response adaptive automatic equalization control by the phase-interpolation-type tap weighting factor control means, and the processing shifts to an interval-control-type partial response adaptive automatic equalization control which discretely reflects a cumulative additional value of an equalization error amount on a tap weighting factor in a state where an equalization error by the partial response adaptive automatic equalization control is under a prescribed value.

16. The digital recorded data reproducing device as defined in claim 15, wherein the frequency error detector comprises:

a zero-cross length detector for detecting an interval at which the output signal of the high-order interpolation filter crosses zero level;

a synchronization pattern length detector for detecting whether a ratio of neighboring zero-cross lengths coincides with a prescribed synchronization pattern length on the basis of the ratio or not to obtain first cycle information which reflects a reproduction speed of the recording medium; and a synchronization pattern interval detector for detecting an interval until the synchronization pattern is detected to detect second cycle information based on this and a prescribed period.

17. The digital recorded data reproducing device as defined in claim 12, wherein the tap weighting factor setting means sets a feedback gain when the filter factor for phase control is updated so as to be sufficiently larger than a feedback gain when the filter factor for the partial response equalization is updated, and updates the filter factor for the partial response equalization discretely.

18. A digital recorded data reproducing device comprising:

a preamplifier for emphasizing an output amplitude of a reproduction signal from a recording medium;

a waveform equalizing means for emphasizing a prescribed frequency band of the emphasized signal;

an analog/digital converting means for sampling the equalized signal to a digital data with multiple bits asynchronously with a phase of a clock component included in the signal by a clock generated by an oscillator;

an offset correction means for decreasing an offset component from the sampled signal;

an automatic gain control means for adjusting the amplitude of the output signal to a required level;

a transversal filter for subjecting the signal subjected to the amplitude adjustment to a partial response equalization;

a high-order interpolation filter for reproducing a signal in a regular sampling phase from the signal subjected to the partial response equalization by a high-order interpolation;

a tap weighting factor control means for controlling a tap weighting factor of the transversal filter from the interpolation output signal adaptively so that an equalization error is minimum;

a phase comparator for detecting a phase error from the interpolation output signal; and a loop filter for smoothing the phase error signal; and a maximum likelihood decoder for subjecting the interpolation output signal to a maximum likelihood decoding according to a type of partial response at equalization by the transversal filter so as to perform a data demodulation, as well as comprising:

a frequency control means for performing a control based on a cycle of a synchronization pattern included in recording data and a time width with which the synchronization pattern is detected;

a phase synchronization maintaining means for monitoring a control range of the loop filter after a frequency and a frequency of a clock component included in the reproduction signal are pulled in to the neighborhood and performing an up/down control of a clock frequency so that the phase control signal returns to a normal operating range before the signal reaches an area out of phase synchronization control; and an oscillator control means for controlling the oscillator based on an output signal of the frequency control means and an output signal of the phase synchronization maintaining means.

19. The digital recorded data reproducing device as defined in claim 18, wherein the oscillator control means comprises:

a delta/sigma modulator for modulating the control signal at up/down control by the phase synchronization maintaining means; and a low pass filter for smoothing the output signal, thereby to control the oscillator by the output signal.

20. The digital recorded data reproducing device as defined in claim 19 further comprising:

a cut-off frequency varying means for switching a cut-off frequency of the low pass filter according to a reproduction speed of digital recording data.

21. The digital recorded data reproducing device as defined in any of claims 11, 12, and 18, wherein the offset correction means comprises:

an offset detecting means for detecting an offset component held by the sampled signal;

a smoothing means for smoothing the detected offset component; and a subtracting means for subtracting the smoothed signal from the sampled signal.

22. A digital recorded data reproducing device comprising:

a preamplifier for emphasizing an output amplitude of a reproduction signal from a recording medium;

a waveform equalizing means for emphasizing a prescribed frequency band of the emphasized signal;

an analog/digital converting means for sampling the equalized signal to a digital data with multiple bits asynchronously with a phase of a clock component included in the signal by a clock generated by an oscillator;

an offset correction means for decreasing an offset component from the sampled signal;

an automatic gain control means for adjusting the amplitude of the output signal to a required level;

a transversal filter for subjecting the signal subjected to the amplitude adjustment to a partial response equalization;

a high-order interpolation filter for reproducing a signal in a regular sampling phase from the signal subjected to the partial response equalization by a high-order interpolation;

a tap weighting factor control means for controlling a tap weighting factor of the transversal filter from the interpolation output signal adaptively so that an equalization error is minimum;

a phase comparator for detecting a phase error from the interpolation output signal;

a loop filter for smoothing the phase error signal; and a maximum likelihood decoder for subjecting the interpolation output signal to a maximum likelihood decoding according to a type of partial response at equalization by the transversal filter so as to perform a data demodulation, wherein the asynchronously sampled signal is subjected to the partial response equalization, and a phase synchronization is compensated by a phase-interpolation-type digital phase-locked loop so that a data demodulation is performed, as well as the offset correction means performs an offset correction with reference to the output of the high-order interpolation filter.

23. The digital recorded data reproducing device as defined in claim 22, wherein the offset correction means comprises:

a zero-cross amplitude output means for outputting a component in an amplitude direction with respect to a sampling signal at a position where the output signal of the high-order interpolation filter crosses zero;

a polarity value output means for outputting a certain amount of values with different polarity according to a polarity of the signal code with respect to a sampling signal at a position other than the zero-cross position;

a loop filter for offset correction for smoothing the output signal of the zero-cross amplitude output means and the output signal of the polarity value output means; and an offset removing means for performing an offset removal by directly subtracting the output signal from the output signal of the analog/digital converter.

24. The digital recorded data reproducing device as defined in claim 23, wherein the offset correction means comprises:

a polarity value output varying means for varying the output value of the polarity value output means to adjust a ratio of the same to the output value of the zero-cross amplitude output means.

25. The digital recorded data reproducing device as defined in claim 23, wherein the offset correction means comprises:

an output value switching means for switching an output value according to an operating state of the digital recorded data reproducing device, by making the output value of the polarity value output means larger than the output value of the zero-cross amplitude output means at seek, and making the output value of the polarity value output means smaller than the output value of the zero-cross amplitude output means at successive data reproduction.

26. The digital recorded data reproducing device as defined in claim 23, wherein the offset correction means comprises:

a counter for counting a certain period of time; a cumulative adding means for cumulatively adding the output value of the polarity value output means and the output value of the zero-cross amplitude output means between flags outputted from the counter; and a cumulative adding result monitoring means for monitoring the output signal of the cumulative adding means at a timing of the flag where the output signal is outputted from the counter, and, when being judged as a quasi-phase synchronization state, performing a switching to a control in which a ratio of the polarity value output means is high, so as to restore the state to a normal synchronization state.

27. The digital recorded data reproducing device as defined in any of claims 11, 12, 18, and 22, wherein the transversal filter comprises:

plural delay elements having delay amount of unit delay time, to which of the first stage the signal subjected to the amplitude adjustment is inputted and which are interconnected in series;

an multiplier which is set correspondingly to an input of the delay element of the first stage among the plural unit delay elements as well as outputs of a connection point between delay elements and of a delay element of the last stage;

an adder for obtaining the sum total of outputs of the multiplier to generate an output of the filter, wherein a weighting factor inputted to the other input of the multiplier is varied, thereby to realize required equalization characteristics.

28. The digital recorded data reproducing device as defined in any of claims 11, 18, and 22, wherein the high-order interpolation filter comprises:

plural delay elements having delay amount of unit delay time, to which of the first stage the signal subjected to the partial response equalization is inputted and which are interconnected in series;

an multiplier which is set correspondingly to an input of the delay element in the first stage among the plural unit delay elements as well as outputs of a connection point between delay elements and of a delay element in the last stage;

an adder for obtaining the sum total of outputs of the multiplier to generate an output of the filter, wherein a weighting factor inputted to the other input of the multiplier is varied, thereby to realize required equalization characteristics.

29. The digital recorded data reproducing device as defined in claim 28, wherein the high-order interpolation filter performs an interpolation base on Nyquist characteristics.

30. The digital recorded data reproducing device as defined in claim 28, wherein the high-order interpolation filter comprises:
  a register which is set correspondingly to the multiplier and stores each amplitude value when a channel rate of Nyquist characteristics is divided in a time direction; and
  a selector which is set correspondingly to the register and selects the amplitude value stored in the register to output to the corresponding multiplier according to the output phase information of the loop filter.

31. The digital recorded data reproducing device as defined in any of claims 11, 18, and 22, wherein the tap weighting factor control means decides the weighting factor of the transversal filter by Least Mean Square algorithm.

32. The digital recorded data reproducing device as defined in claim 31, wherein the tap weighting factor control means comprises:
  a temporary judging circuit for detecting an equalization target value which corresponds to a partial response system based on the output signal of the high-order interpolation filter;
  an equalization error detector for detecting the equalization error based on the equalization target value and the output signal of the high-order interpolation filter;
  a correlator for detecting correlation between the equalization error and the output signal of the high-order interpolation filter;
  a feedback gain regulator for multiplying an output of the correlator by the same number as a gain to regulate a feedback gain; and
  a tap factor updating part for adding an output of the feedback gain regulator to a weighting factor of each tap to update a tap factor.

* * * * *